US012701781B2

(12) United States Patent
Ching et al.

(10) Patent No.: US 12,701,781 B2
(45) Date of Patent: *Aug. 4, 2026

(54) INTEGRATED CIRCUIT WITH A GATE STRUCTURE AND METHOD MAKING THE SAME

(71) Applicant: Taiwan Semiconductor Manufacturing Co., Ltd., Hsinchu (TW)

(72) Inventors: Kuo-Cheng Ching, Hsinchu County (TW); Ying-Keung Leung, Hsinchu City (TW); Chi On Chui, Hsinchu City (TW)

(73) Assignee: TAIWAN SEMCONDUCTOR MANUFACTURING CO., LTD., Hsinchu (TW)

( * ) Notice: Subject to any disclaimer, the term of this patent is extended or adjusted under 35 U.S.C. 154(b) by 244 days.

This patent is subject to a terminal disclaimer.

(21) Appl. No.: 17/080,387

(22) Filed: Oct. 26, 2020

(65) Prior Publication Data

US 2021/0043626 A1 Feb. 11, 2021

Related U.S. Application Data

(60) Continuation of application No. 16/045,266, filed on Jul. 25, 2018, now Pat. No. 10,818,658, which is a
(Continued)

(51) Int. Cl.
*H10D 84/83* (2025.01)
*H10D 62/10* (2025.01)
(Continued)

(52) U.S. Cl.
CPC ......... *H10D 84/834* (2025.01); *H10D 62/115* (2025.01); *H10D 64/017* (2025.01);
(Continued)

(58) Field of Classification Search
CPC ............. H01L 27/0886; H01L 27/0924; H01L 27/1211; H01L 21/823431;
(Continued)

(56) References Cited

U.S. PATENT DOCUMENTS 5,498,555 A * 3/1996 Lin ..................... H01L 29/6659
438/304
6,218,235 B1 * 4/2001 Hachisuka ............. H10B 12/05
257/E21.654
(Continued)

FOREIGN PATENT DOCUMENTS

| JP | 2003347428 | 12/2003 |
| KR | 00000019876 | 4/2000 |
(Continued)

*Primary Examiner* — Mary A Wilczewski
(74) *Attorney, Agent, or Firm* — HAYNES AND BOONE, LLP

(57) ABSTRACT

The present disclosure provides a semiconductor structure. The semiconductor structure includes a fin structure on a substrate; a first gate stack and a second gate stack formed on the fin structure; a dielectric material layer disposed on the first and second gate stacks, wherein the dielectric layer includes a first portion disposed on a sidewall of the first gate stack with a first thickness and a second portion disposed on a sidewall of the second gate stack with a second thickness greater than the first thickness; a first gate spacer disposed on the first portion of the dielectric material layer; and a second gate spacer disposed on the second portion of the dielectric material layer.

20 Claims, 15 Drawing Sheets

Related U.S. Application Data division of application No. 15/379,632, filed on Dec. 15, 2016, now Pat. No. 10,651,171.

(51) Int. Cl.

| | |
|---|---|
| *H10D 64/01* | (2025.01) |
| *H10D 64/27* | (2025.01) |
| *H10D 84/01* | (2026.01) |
| *H10D 84/03* | (2025.01) |
| *H10D 84/85* | (2025.01) |
| *H10P 14/60* | (2026.01) |
| *H10P 14/61* | (2026.01) |
| *H10P 14/694* | (2026.01) |
| *H10P 95/00* | (2026.01) |

(52) U.S. Cl.

CPC ....... *H10D 64/513* (2025.01); *H10D 84/0144* (2025.01); *H10D 84/0147* (2025.01); *H10D 84/0158* (2025.01); *H10D 84/0193* (2025.01); *H10D 84/038* (2025.01); *H10D 84/853* (2025.01); *H10P 14/61* (2026.01); *H10P 14/6339* (2026.01); *H10P 14/6682* (2026.01); *H10P 14/6687* (2026.01); *H10P 14/69433* (2026.01); *H10P 95/00* (2026.01); *H10D 84/0142* (2025.01)

(58) Field of Classification Search

CPC ........... H01L 21/823821; H01L 21/845; H01L 29/41791; H01L 29/785; H01L 29/7855; H01L 29/66545; H01L 29/66553; H01L 29/81791; H10D 84/0142; H10D 84/0144; H10D 84/0147; H10D 64/021; H10D 64/513; H10D 64/514; H10D 64/516

See application file for complete search history.

(56) References Cited

U.S. PATENT DOCUMENTS

| | | | |
|---|---|---|---|
| 6,737,716 B1 | 5/2004 | Matsuo et al. | |
| 6,808,974 B2 * | 10/2004 | Park ................ | H01L 21/823814 |
| | | | 438/232 |
| 7,235,835 B2 * | 6/2007 | Nagano ............. | H01L 21/82385 |
| | | | 257/E21.654 |
| 7,544,561 B2 | 6/2009 | Lin et al. | |
| 7,667,271 B2 | 2/2010 | Yu et al. | |
| 7,829,978 B2 | 11/2010 | Chen et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,492,228 B1 | 7/2013 | Leobandung et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |

| | | | |
|---|---|---|---|
| 9,105,490 B2 | 8/2015 | Wang et al. | |
| 9,530,778 B1 | 12/2016 | Lin et al. | |
| 9,570,467 B2 | 2/2017 | Hafez et al. | |
| 9,780,107 B2 * | 10/2017 | Meotto ................. | H10B 43/40 |
| 10,115,895 B1 * | 10/2018 | Takaki .................. | H01L 27/249 |
| 10,516,032 B2 * | 12/2019 | Wu .................... | H01L 29/42392 |
| 10,651,171 B2 * | 5/2020 | Ching ................. | H01L 29/0649 |
| 10,658,486 B2 * | 5/2020 | Huang ............... | H01L 29/4983 |
| 10,818,658 B2 * | 10/2020 | Ching ................ | H01L 29/0649 |
| 2001/0025970 A1 * | 10/2001 | Nozaki ............ | H01L 27/14689 |
| | | | 257/E27.132 |
| 2003/0219944 A1 * | 11/2003 | Kato ................. | H01L 21/76804 |
| | | | 438/257 |
| 2004/0137373 A1 | 7/2004 | Lei et al. | |
| 2004/0232494 A1 * | 11/2004 | Nagano .......... | H01L 21/823864 |
| | | | 257/E21.654 |
| 2005/0051866 A1 | 3/2005 | Wang et al. | |
| 2005/0090066 A1 * | 4/2005 | Zhu ................... | H01L 29/66772 |
| | | | 257/E21.429 |
| 2005/0112817 A1 | 5/2005 | Cheng et al. | |
| 2006/0151840 A1 * | 7/2006 | Maekawa ....... | H01L 21/823418 |
| | | | 257/E21.624 |
| 2008/0122011 A1 | 5/2008 | Wu | |
| 2008/0258227 A1 | 10/2008 | Wang et al. | |
| 2009/0206406 A1 * | 8/2009 | Rachmady ........ | H01L 21/28114 |
| | | | 257/E29.264 |
| 2009/0212332 A1 * | 8/2009 | Wang ................. | H01L 29/4983 |
| | | | 257/E21.409 |
| 2010/0038705 A1 * | 2/2010 | Doris ................ | H01L 21/28026 |
| | | | 438/303 |
| 2010/0072545 A1 | 3/2010 | Ryu et al. | |
| 2011/0117709 A1 * | 5/2011 | Lin ................. | H01L 21/823462 |
| | | | 257/E21.639 |
| 2011/0180859 A1 * | 7/2011 | Tatani ................. | H01L 27/1463 |
| | | | 257/E27.113 |
| 2011/0186915 A1 * | 8/2011 | Scheiper .......... | H01L 29/66545 |
| | | | 257/E21.409 |
| 2012/0104509 A1 * | 5/2012 | Matsumoto ......... | H01L 27/0924 |
| | | | 438/300 |
| 2013/0032900 A1 * | 2/2013 | Hou .................... | H01L 29/4958 |
| | | | 257/E21.174 |
| 2013/0134520 A1 | 5/2013 | Maeda et al. | |
| 2013/0161762 A1 * | 6/2013 | Kelly ............... | H01L 29/42376 |
| | | | 257/E27.06 |
| 2014/0001574 A1 | 1/2014 | Chen et al. | |
| 2014/0070285 A1 * | 3/2014 | Xie ................. | H01L 21/823431 |
| | | | 257/288 |
| 2014/0110755 A1 | 4/2014 | Colinge | |
| 2016/0163825 A1 * | 6/2016 | Yin ................... | H01L 29/42376 |
| | | | 257/408 |
| 2016/0315013 A1 | 10/2016 | Tokita | |
| 2017/0200803 A1 | 7/2017 | Lee | |
| 2018/0035080 A1 | 2/2018 | Sinclair | |
| 2018/0166560 A1 * | 6/2018 | Chiang ............ | H01L 21/82345 |
| 2018/0175029 A1 | 6/2018 | Ching et al. | |
| 2020/0243663 A1 * | 7/2020 | Huang ................... | H01L 29/78 |
| 2021/0043626 A1 * | 2/2021 | Ching ................ | H01L 29/0649 |
| 2021/0375865 A1 * | 12/2021 | Matsumoto ......... | H01L 29/0847 |

FOREIGN PATENT DOCUMENTS

| | | | | |
|---|---|---|---|---|
| KR | 20160063224 | | 6/2016 | |
| KR | 20160123818 | | 10/2016 | |
| KR | 20160137305 | | 11/2016 | |
| WO | WO 03/096421 | * | 11/2003 | ........... H01L 27/088 |

* cited by examiner

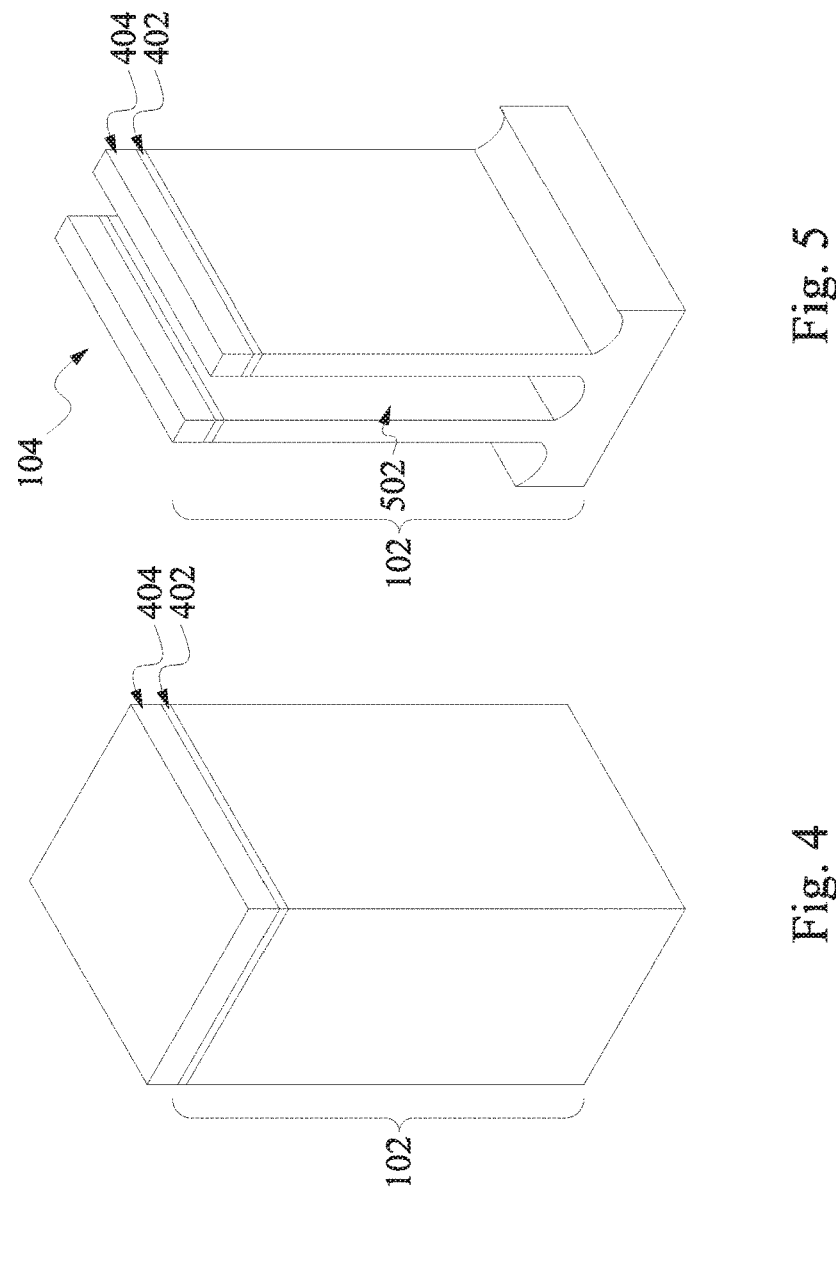
Fig. 5
Fig. 4
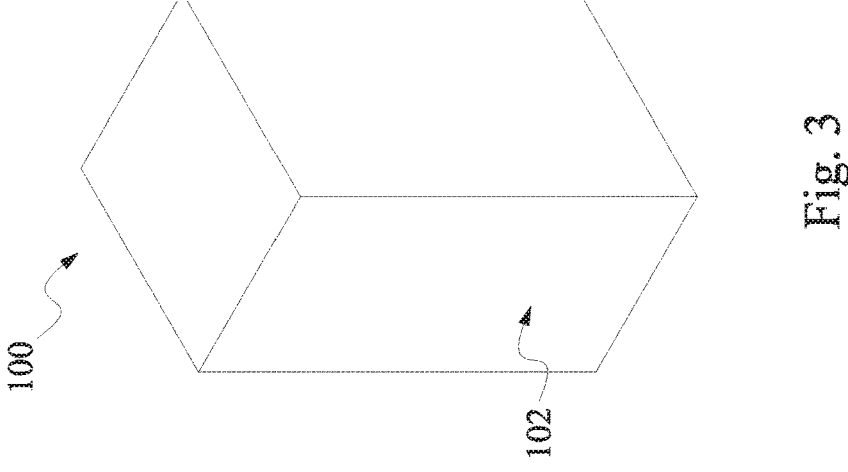
Fig. 3

INTEGRATED CIRCUIT WITH A GATE STRUCTURE AND METHOD MAKING THE SAME

PRIORITY DATA

The present application is a continuation application of U.S. application Ser. No. 16/045,266, filed Jul. 25, 2018, which is a divisional application of U.S. application Ser. No. 15/379,632, filed Dec. 15, 2016, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized. Similar developments in IC processing and manufacturing are needed. For example, a three dimensional transistor, such as a fin-like field-effect transistor (FinFET), has been introduced to replace a planar transistor. A FinFET can be thought of as a typical planar device extruded into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

However, because of the complexity inherent in FinFETs and other nonplanar devices, and further because of the high pattern density in the advanced technology modes, a number of techniques used in manufacturing planar transistors are not well suited to fabricating nonplanar devices. As merely one example, conventional techniques for forming gate stacks on a semiconductor substrate may produce undesirable sticking issue. In the advanced technology nodes, the height of the transistor gates needs to be very higher. For example, when the gate length is less than 20 nm, the gate aspect ratio, defined as the gate height over the gate width, can be greater than 15. The high gate aspect ratio may cause adjacent gates to stick together, especially during various processes, such as wet etching and cleaning. The existing methods, such as a treatment process by stress management technique do not work effectively with the products with high gate aspect ratio, such as greater than 17.

Therefore, while existing fabrication techniques have been generally adequate for planar devices, in order to continue to meet ever-increasing design requirements, further advances are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 through 11 are perspective views of a semiconductor structure at various fabrication stages, constructed in accordance with some embodiments.

DETAILED DESCRIPTION

Figure 1:
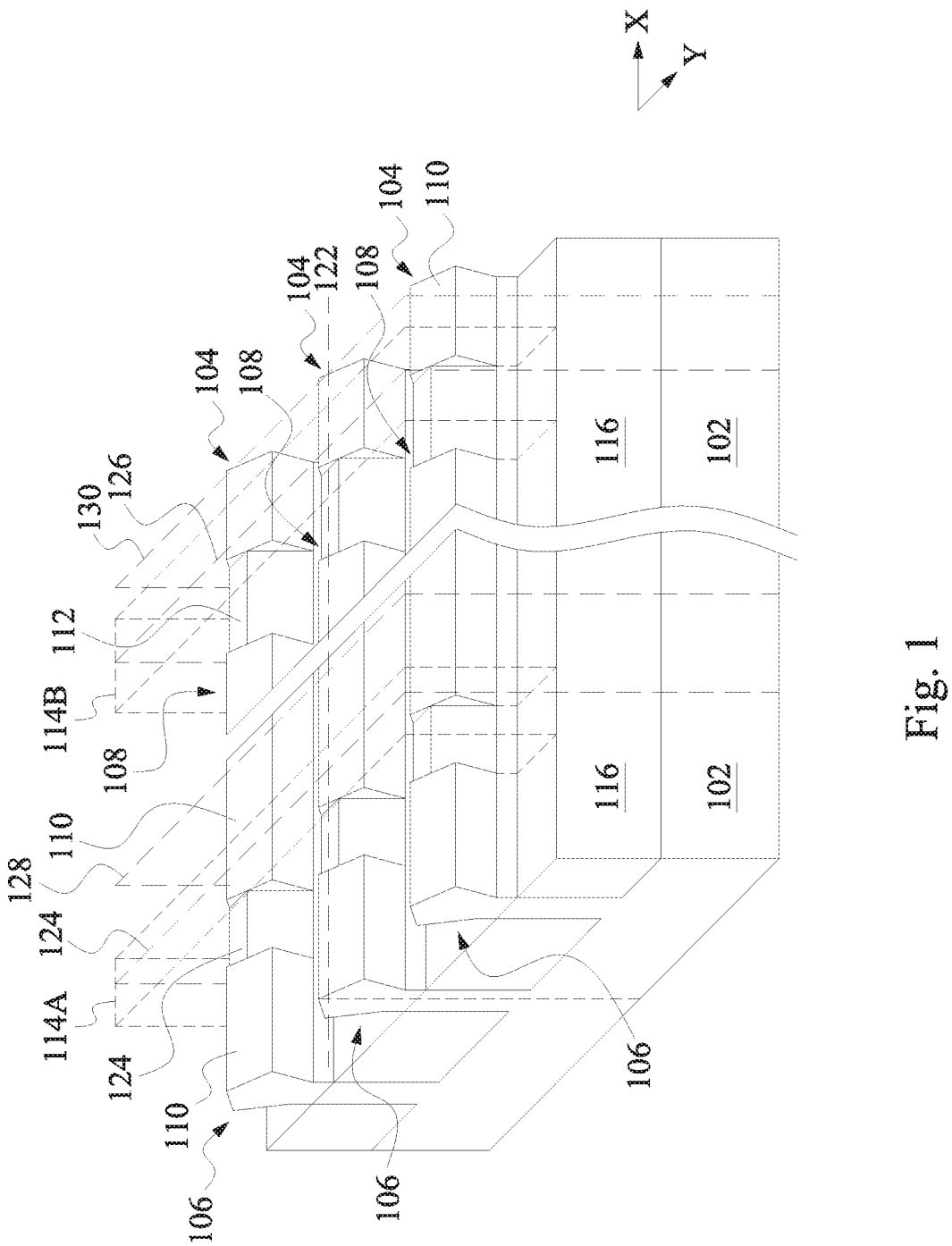
FIG. 1 is a perspective view of a semiconductor structure, constructed in accordance with some embodiments.

The present disclosure relates generally to IC device manufacturing and, more particularly, to an insulating layer that isolates a FinFET from a substrate upon which it is formed and to tuning the channel strain generated by the insulating layer to suit the channel type of the FinFET.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a perspective view of a portion of a workpiece 100 according to various aspects of the present disclosure. FIG. 1 has been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102. The substrate 102 includes a bulk silicon substrate. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SI-MOX), wafer bonding, and/or other suitable methods. The substrate 102 also includes various isolation features, such as shallow trench isolation (STI) features 116 and active regions 104 defined by the STI features 116.

In some embodiments, the active regions 104 are extended above the isolation features 116 with non-planar structure, such as a fin structure. The fin structure has one or more raised active regions (or fin active regions) separated by the STI features. While the illustrated embodiments include a fin structure, further embodiments include other raised active and passive devices formed upon the substrate 102.

The workpiece 100 includes FETs, such as n-channel field effect transistor (nFET) and a p-channel field effect transistor (pFET). In some one example that the active regions are defined in the fin structure, the workpiece 100 includes FinFETs, such as exemplary an n-channel FinFET and a p-channel FinFET.

In the present embodiment, the workpiece 100 includes one (or more) first FET 106 designed as a core devices and one (or more) second FET 108 designed as an input/output (I/O) device. Those devices are designed differently and formed by the disclosed method, which will be described through the detailed description. In turn, each of FETs 106 and 108 includes a pair of opposing source/drain features (or source/drain regions) 110, which may include various doped semiconductor materials, and a channel region 112 disposed between the source/drain regions 110. The flow of carriers (electrons for the n-channel device and holes for the p-channel device) through the channel region 112 is controlled by a voltage applied to a gate stack 114 (such as 114A and 114B) adjacent to the channel region 112 (and overwrapping the channel region 112 when the active regions are defined in a fin structure). The gate stack 114 is shown as translucent to better illustrate the underlying channel region 112.

In some embodiments, the active regions are defined in the fin structure, the channel region 112 rises above the STI features 116. The raised channel region 112 provides a larger surface area proximate to the gate stack 114 than comparable planar devices. This strengthens the electromagnetic field interactions between the gate stack 114 and the channel region 112, which may reduce threshold voltage, leakage and short channel effects associated with smaller devices. Thus in many embodiments, FinFETS and other nonplanar devices deliver better performance in a smaller footprint than their planar counterparts.

In various embodiments, the methods and structures of the present disclosure provide FETs 106 and 108 with different structures including corresponding gate dielectric layers and gate sidewall dielectric material layers, such as different thicknesses. In the present embodiment, the semiconductor material of the substrate 102 includes silicon and may further include other semiconductor material, such as silicon germanium (SiGe) for strain effect or other performance enhancement. The active regions 104 have elongated shapes oriented in the X direction while the gate stacks 114 have elongated shapes oriented in the Y direction. The X and Y directions are orthogonal from each other.

In some embodiments, the structure and the method of the present disclosure may provide the channel regions 112 that is un-doped and has higher carrier mobility and further enhanced device performance, such as increased device speed. In some other embodiments, the channel region 112 may be alternatively doped with proper types of dopants.

Figure 2:
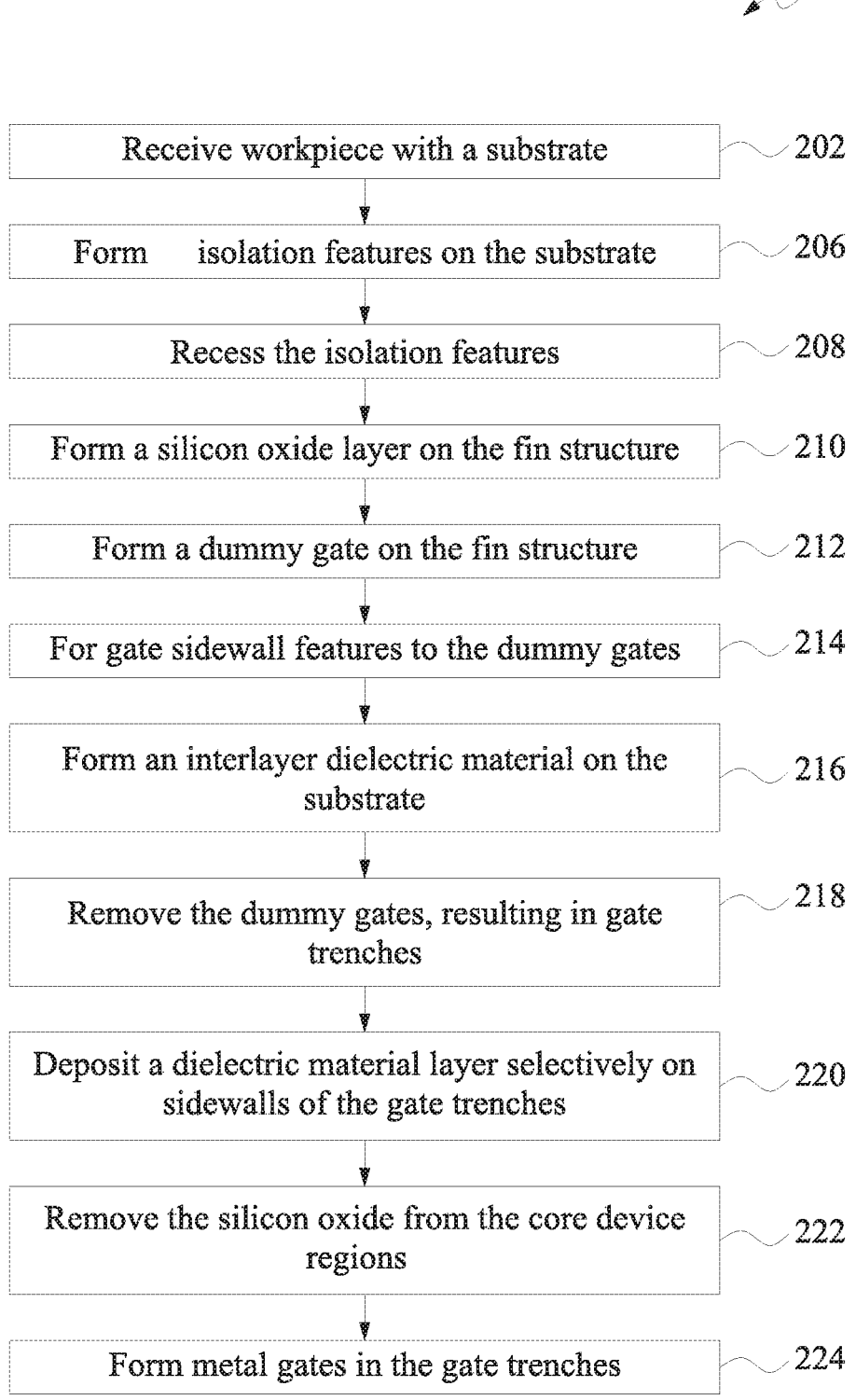
FIG. 2 is a flowchart of an integrated circuit fabrication method in accordance with some embodiments.

Exemplary methods of forming the workpiece 100 having FET devices (such as 106 and 108) will now be described with reference to FIGS. 2-17. FIG. 2 is a flowchart of a method 200 for fabricating FET devices on a workpiece 100 according to various aspects of the present disclosure. The figures that follow refer perspective views of the workpiece 100, and/or cross-sections taken through the channel region 112 (e.g., along plane 122, plane 124 or 126) or through the source/drain regions 110 (e.g., along plane 128 or plane 130) of the FET devices.

The method 200 and the structure of the workpiece 100 are collectively described according to various aspects of the present disclosure. It is understood that additional steps can be provided before, during, and after the method 200 and that some of the steps described can be replaced or eliminated for other embodiments of the method. In the following description, the active regions are also collectively referred to as fin structure 104. However, active regions are not limited to fin active regions in the fin structure.

Referring first to block 202 of FIG. 2 and to FIG. 3, a workpiece 100 is received that includes a substrate 102, such as a silicon substrate. The substrate 102 may alternatively or additionally include an elementary semiconductor, a compound semiconductor, or combinations thereof. The substrates 102 may also include a SOI substrate.

Various doping process may be applied to the substrate 102 through a proper method, such as ion implantation. In the present embodiment, an anti-punch-through (APT) process is applied to the substrate 102 to introduce proper dopants to respective regions of the substrate through ion implantations. The APT process may include forming a hard mask with openings defining regions for nFETs; performing an ion implantation to the nFET regions; and removing the hard mask, and similar steps for pFETs.

The received workpiece 100 may have one or more layers formed upon it. In one embodiment illustrated in FIG. 4, the substrate 102 includes a semiconductor layer 402, such as silicon, epitaxially grown on bulk silicon, such as a silicon wafer. In other illustrated embodiment, the substrate 102 includes a first semiconductor layer formed on bulk silicon and a second semiconductor layer formed on the first semiconductor layer. The first semiconductor layer includes a first semiconductor material (such as SiGe) and the second semiconductor layer includes a second semiconductor material (such as Si) different from the first semiconductor material. The first and second semiconductor layers are epitaxially grown by suitable techniques, such as selective epitaxy growth (SEG). In some embodiments, suitable deposition processes for epitaxy growth include atomic layer deposition (ALD), chemical vapor deposition (CVD), high-density plasma CVD (HDP-CVD), physical vapor deposition (PVD) and/or other suitable deposition processes. Any of these techniques may be used to grow the semiconductor layer 402 having any composition including a graduated composition.

In some embodiments, the semiconductor layer 402 may be formed without doping, therefore also referred to as un-doped semiconductor layer. For example, during the deposition, the precursor does not include dopant-containing chemical. In furtherance of the example, no further ion implantation is implemented to eliminate introduce dopant to the semiconductor layer 402. In this embodiment, the formed channel region is un-doped and has fewer defects.

To facilitate fabrication and to avoid damage to the semiconductor layer, one or more hard mask layer 404 may be formed on the substrate 102, such as on the semiconductor layer 402. The hard mask layers 404 include a dielectric such as semiconductor oxide, semiconductor nitride, semiconductor oxynitride, and/or semiconductor carbide, and in an exemplary embodiment, the hard mask layer 404 include a silicon oxide film and a silicon nitride film. The hard mask layer 404 may be formed by thermal growth, ALD, CVD, HDP-CVD, PVD, and/or other suitable deposition processes.

A photoresist layer (or resist) used to define the fin structure 104 in later operations of the method 200 may be formed on the hard mask layer 404. An exemplary resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic patterning.

In one embodiment, the resist layer is patterned to leave the portions of the photoresist material disposed over the workpiece 100 by the lithography process. After patterning the resist, an etching process is performed on the workpiece 100 to open the hard mask layer 404, thereby transferring the pattern from the resist layer to the hard mask layer 404. The remaining resist layer may be removed after the patterning the hard mask layer 404. An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the hard mask layer may include wet etching, dry etching or a combination thereof. The etching process may include multiple etching steps. For example, the silicon oxide film in the hard mask layer may be etched by a diluted hydrofluorine solution and the silicon nitride film in the hard mask layer may be etched by a phosphoric acid solution.

Figure 6:
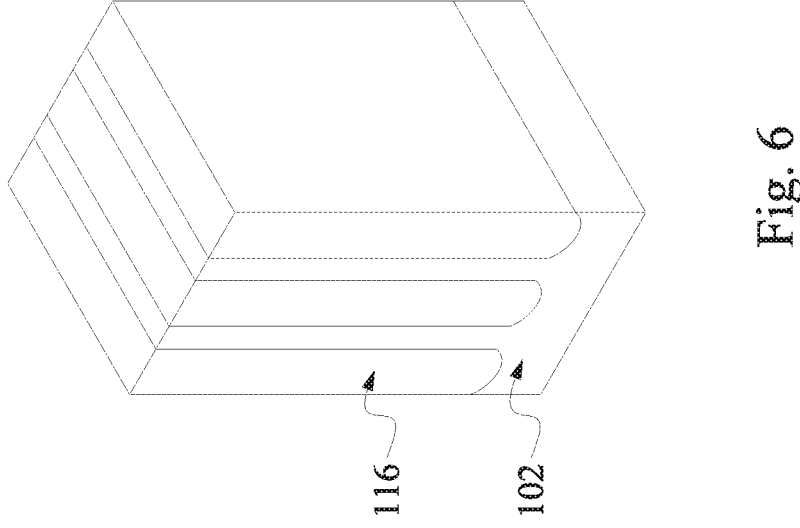

Referring to block 206 of FIG. 2 and to FIGS. 5-6, STI features 116 are formed in the substrate 102. The substrate 102 (including the semiconductor layer 402 in the present example) is etched to define the fin structure 104 through openings of the patterned hard mask layer 404. One or more etching processes are performed on the workpiece 100 to etch the portions of the substrate 102 not covered by the patterned hard mask layer 404. The patterned hard mask layer 404 is used as an etch mask during the etching processes to pattern the substrate.

The etching processes may include any suitable etching technique such as dry etching, wet etching, and/or other etching methods (e.g., reactive ion etching (RIE)). In some embodiments, the etching process includes multiple etching steps with different etching chemistries, each targeting a particular material of the workpiece 100. In some examples, the semiconductor material of the substrate may be etched by a dry etching process using a fluorine-based etchant.

The etching processes are designed to produce fin structure 104 of any suitable height and width extending above the reminder of the first semiconductor layer 302. In addition to defining the fin structure 104, the etching process also define one or more isolation trench 502 between the active regions of the fin structure 104.

Particularly, the etching process applied to the substrate is controlled such that the substrate 102 is partially etched, as illustrated in FIG. 5. This may be achieved by controlling etching time or by controlling other etching parameter(s). After the etching processes, the fin structure is formed and extended from the substrate 102.

Referring to FIG. 6, one or more isolation feature 116 is formed on the substrate 102. In the present embodiment, the isolation feature 116 is formed in the isolation trench 502, and therefore also referred to as STI feature. One or more dielectric material is filled in the trench 502 to form the isolation feature 116. Suitable fill dielectric materials include semiconductor oxides, semiconductor nitrides, semiconductor oxynitrides, FSG, low-K dielectric materials, and/or combinations thereof. In various exemplary embodiments, the dielectric material is deposited using a HDP-CVD process, a sub-atmospheric CVD (SACVD) process, a high-aspect ratio process (HARP), a flowable CVD (FCVD), and/or a spin-on process.

The deposition of the dielectric material may be followed by a chemical mechanical polishing/planarization (CMP) process. The CMP process may use the hard mask layers 404 as a polishing stop layer to prevent polishing the semiconductor layer 402. In the illustrated embodiment, the CMP process completely removes the hard mask layers 404, although in further embodiments, some portion of the hard mask layers 404 remain after the CMP process.

Figure 7:
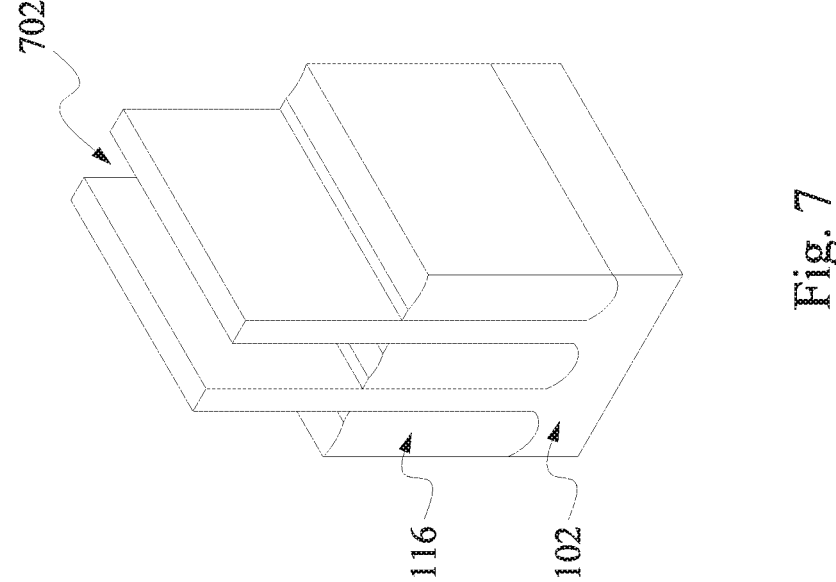

Referring to block 208 of FIG. 2 and to FIG. 7, the isolation feature 116 is recessed, thereby forming a fin structure 104 and trenches 702 between the fin active regions. The fin active regions are electrically isolated from each other by the isolation feature 116. Any suitable etching technique may be used to recess the fill dielectric material including dry etching, wet etching, RIE, and/or other etching methods, and in an exemplary embodiment, an anisotropic dry etching is used to selectively remove the fill dielectric material of the isolation feature without etching the fin structure 104.

Figure 8:
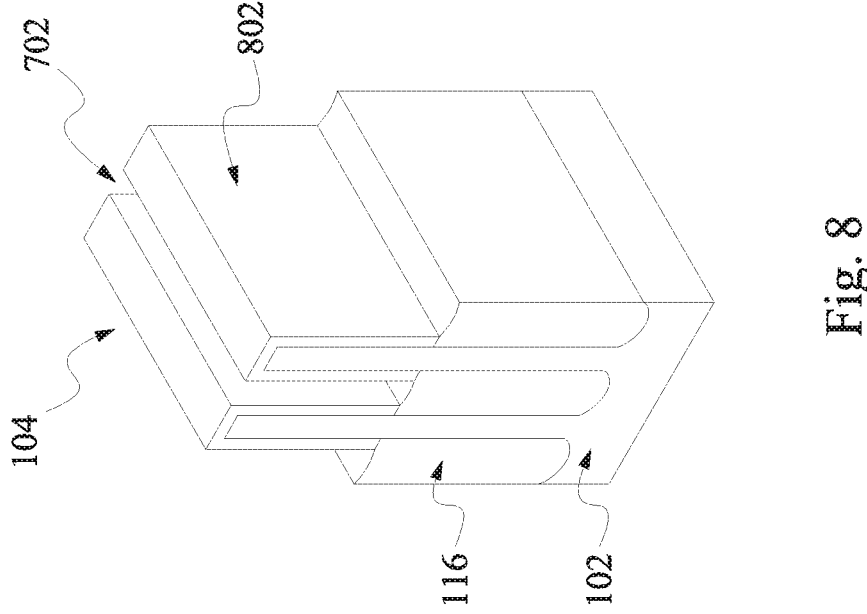

Referring to block 210 of FIG. 2 and to FIG. 8, a dielectric material layer 802 is formed on the fin structure 104 within the I/O device region. The 802 serves as the gate dielectric layer for the I/O FinFETs, or as a part of the gate dielectric layer of the I/O FinFETs so the I/O FinFETs have a thicker gate dielectric layer for robust performance due to I/O devices experience more harsh power surge. In some embodiments, the dielectric layer 802 includes silicon oxide deposited by a suitable method, such as ALD, CVD, thermal oxidation, ozone oxidation, etc. The formation of the dielectric layer 802 may further include a subsequent annealing process to improve the material quality, such as increasing the material density and reducing the defects. In the present embodiment, the dielectric material layer is deposited on the fin structure in both core device region and I/O device region, and is subsequently removed from the core device region after dummy gates are removed.

Figure 9:
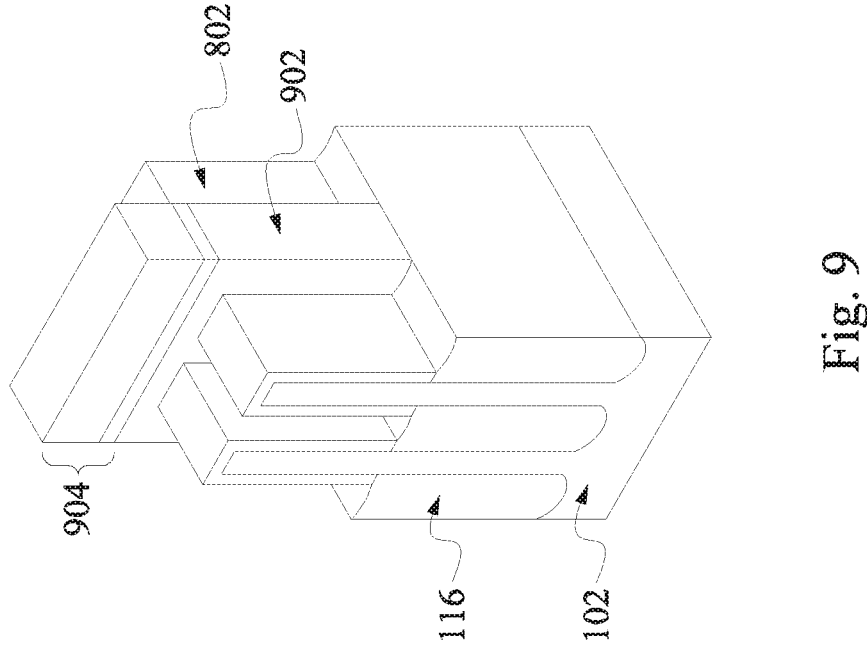

Referring to block 212 of FIG. 2 and to FIG. 9, one or more dummy gate 902 is formed on the fin structure 104. The dummy gate 902 is formed over the channel region 112. In some examples, forming the dummy gate 902 includes depositing a dummy gate layer containing polysilicon or other suitable material and patterning the layer by a lithographic process and etching. A gate hard mask layer 904 may be formed on the dummy gate material layer and is used as an etch mask during the formation of the dummy gate. The gate hard mask layer 904 may include any suitable material, such as a silicon oxide, a silicon nitride, a silicon carbide, a silicon oxynitride, other suitable materials, and/or combinations thereof. In one embodiment, the gate hard mask 904 includes multiple films, such as silicon oxide and silicon nitride. In some embodiments, the patterning process to form the dummy gate includes forming a patterned resist layer by lithography process; etching the hard mask layer using the patterned resist layer as an etch mask; and etching the gate material layer to form the dummy gate using the patterned hard mask layer as an etch mask.

Figure 11:
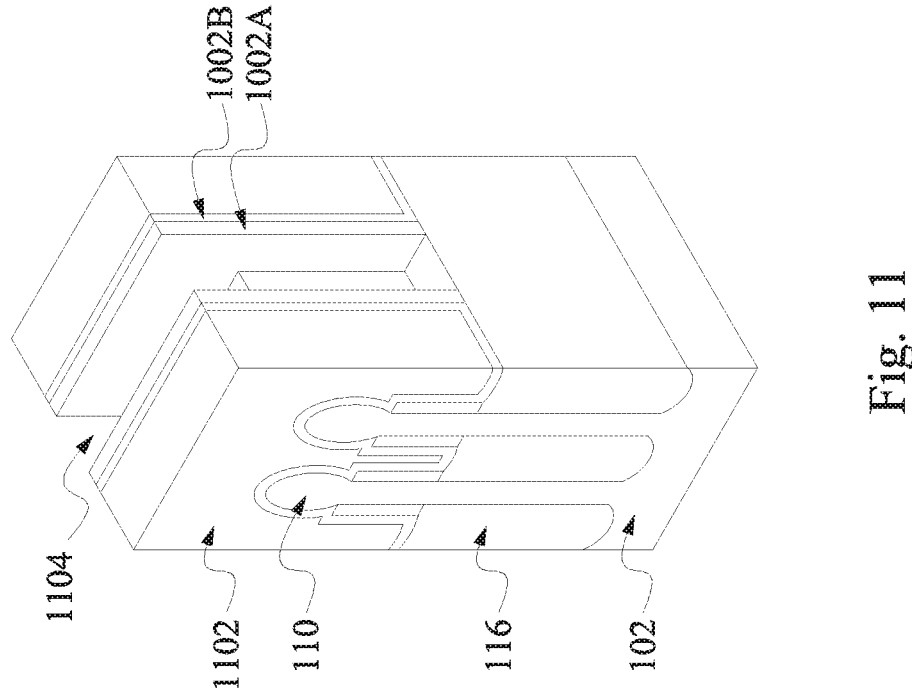
Figure 10:
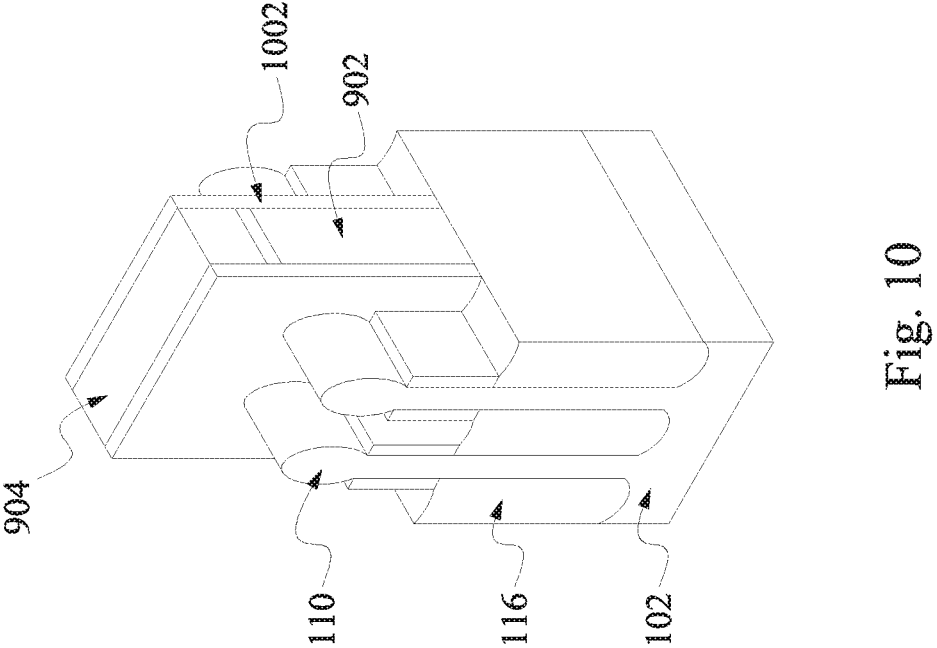

Referring to block 214 of FIG. 2 and to FIG. 10, one or more gate sidewall feature 1002 is formed on the sidewalls of the dummy gate 902. The gate sidewall feature 1002 may be used to offset the subsequently formed source/drain features and may be used for designing or modifying the source/drain structure profile. The gate sidewall feature 1002 may include any suitable dielectric material, such as a semiconductor oxide, a semiconductor nitride, a semiconductor carbide, a semiconductor oxynitride, other suitable dielectric materials, and/or combinations thereof. The gate sidewall feature 1002 has an inner surface directly contacting the sidewall of the dummy gate 902, wherein the inner surface has a composition different from that of the dielectric material layer 802 that directly contacting the bottom surface of the dummy gate 902. This is designed in a way to provide selective deposition in the later stage. For example, the dielectric material layer 802 is silicon oxide while the inner surface of the gate sidewall feature 1002 is silicon nitride. In some embodiments, the gate sidewall feature 1002 may include multiple layers, such as a first gate spacer (or a seal layer) 1002A on sidewalls of the dummy gates 902 and a second gate spacer 1002B on the seal layer, as illustrated in FIG. 11. In furtherance of the embodiments, the seal layer 1002A is silicon nitride and the second gate spacer 1002B is silicon oxide or alternatively silicon nitride. Each gate sidewall feature including the seal layer (or the first gate spacer) and the second gate spacer is also collectively referred to as gate spacer. The formation of the gate sidewall features 1002 includes deposition and anisotropic etching, such as dry etching. In one example, the seal layer 1002A is formed by ALD and the gate spacer 1002B is formed by deposition and anisotropic etching.

In some embodiments, raised source/drain features 110 are formed within the source/drain regions. The raised source/drain features may be formed by selective epitaxy growth for strain effect with enhanced carrier mobility and device performance. The dummy gate 902 and gate spacer 1002 limit the source/drain features 110 to the source/drain regions. In many embodiments, the source/drain features 110 are formed by one or more epitaxy or epitaxial (epi) processes, whereby Si features, SiGe features, SiC features, and/or other suitable features are grown in a crystalline state on the fin structure 104. Alternatively, an etching process is applied to recess the source/drain regions before the epitaxy growgth. Suitable epitaxy processes include CVD deposition techniques (e.g., vapor-phase epitaxy (VPE) and/or ultra-high vacuum CVD (UHV-CVD), molecular beam epitaxy, and/or other suitable processes. The epitaxy process may use gaseous and/or liquid precursors, which interact with the composition of the fin structure 104.

The source/drain features 110 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features 110 are not in-situ doped, an implantation process (i.e., a junction implant process) is performed to introduce the corresponding dopant into the source/drain features 110. In an exemplary embodiment, the source/drain features 110 in an nFET include SiCP or SiP, while those in a pFET include GeSnB (tin may be used to tune the lattice constant) and/or SiGeSnB. In some other embodiments, the raised source/drain features 110 include more than one semiconductor material layers. For example, a silicon germanium layer is epitatially grown on the substrate within the source/drain regions and a silicon layer is epitaxially grown on the silicon germanium layer. One or more annealing processes may be performed thereafter to activate the source/drain features 110. Suitable annealing processes include rapid thermal annealing (RTA), laser annealing processes, other suitable annealing technique or a combination thereof.

Referring to block 216 of FIG. 2 and to FIG. 11, an inter-level dielectric material (ILD) 1102 is formed on the substrate to cover the source/drain features 110 in the source/drain regions. The ILD 1102 surround the dummy gate 902 and the gate sidewall features (or gate spacers) 1002 allowing the dummy gate 902 to be removed and a replacement gate 114 to be formed in the resulting cavity (also referred to as gate trench) 1104. Accordingly, in such embodiments, the dummy gate 902 is removed after depositing the ILD 1102 as shown in FIG. 11. The ILD 1102 may also be part of an electrical interconnect structure that electrically interconnects various devices of the workpiece 100. In such embodiments, the ILD 1102 acts as an insulator that supports and isolates the conductive traces. The ILD 1102 may include any suitable dielectric material, such as a semiconductor oxide, a semiconductor nitride, a semiconductor oxynitride, other suitable dielectric materials, or combinations thereof. In some embodiments, the formation of the ILD 1102 includes deposition and CMP to provide a planarized top surface. The hard mask 904 may be removed during the CMP process, an additional etching operation, or a combination thereof.

Referring to block 218 of FIG. 2 and to FIG. 11, the dummy gate 902 is removed, resulting in a gate trench 1104. In some embodiments, the dummy gate is removed by an etching process, such as a wet etch, to selectively remove the dummy gate. The etching process may include multiple etching steps to remove the dummy gate if more materials present.

Figure 12B:
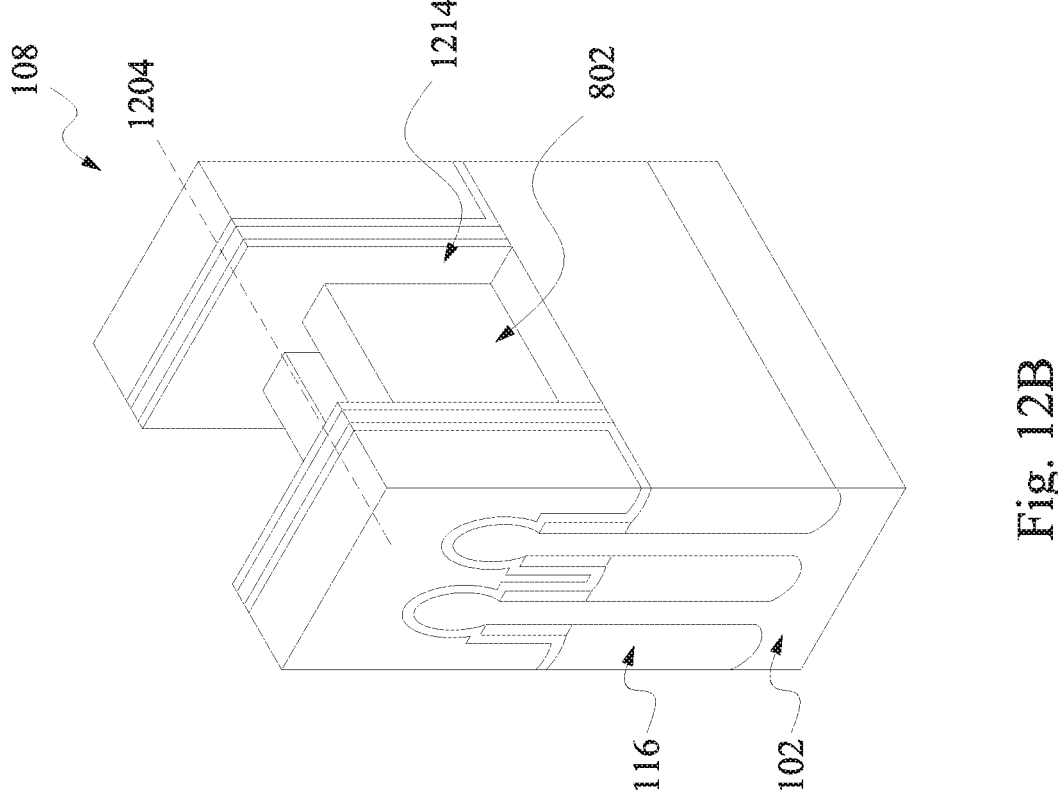
FIGS. 12A and 12B are perspective views of the semiconductor structure at a fabrication stage, constructed in accordance with some embodiments.
Figure 12A:
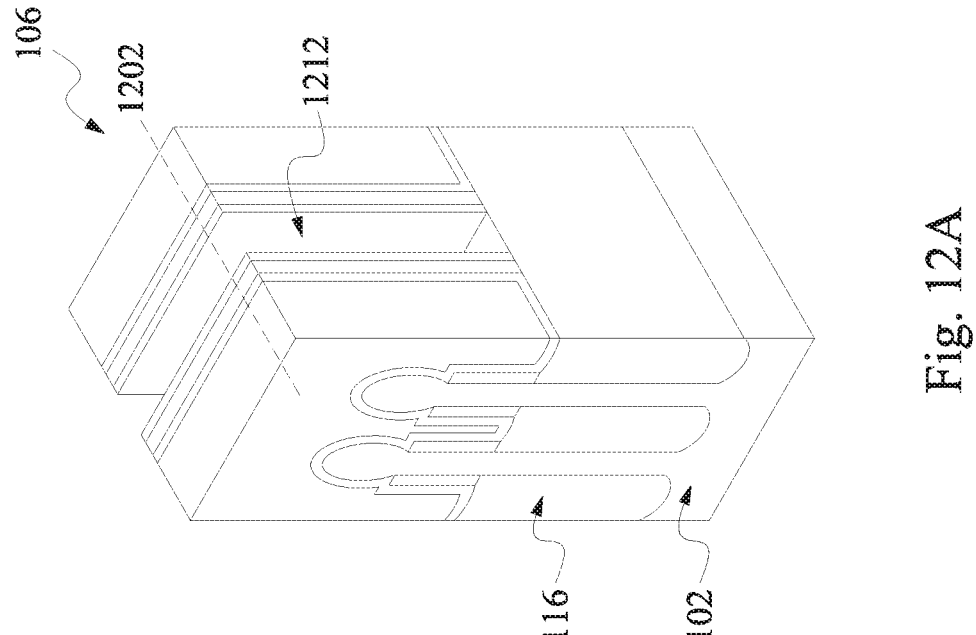
Figure 12D:
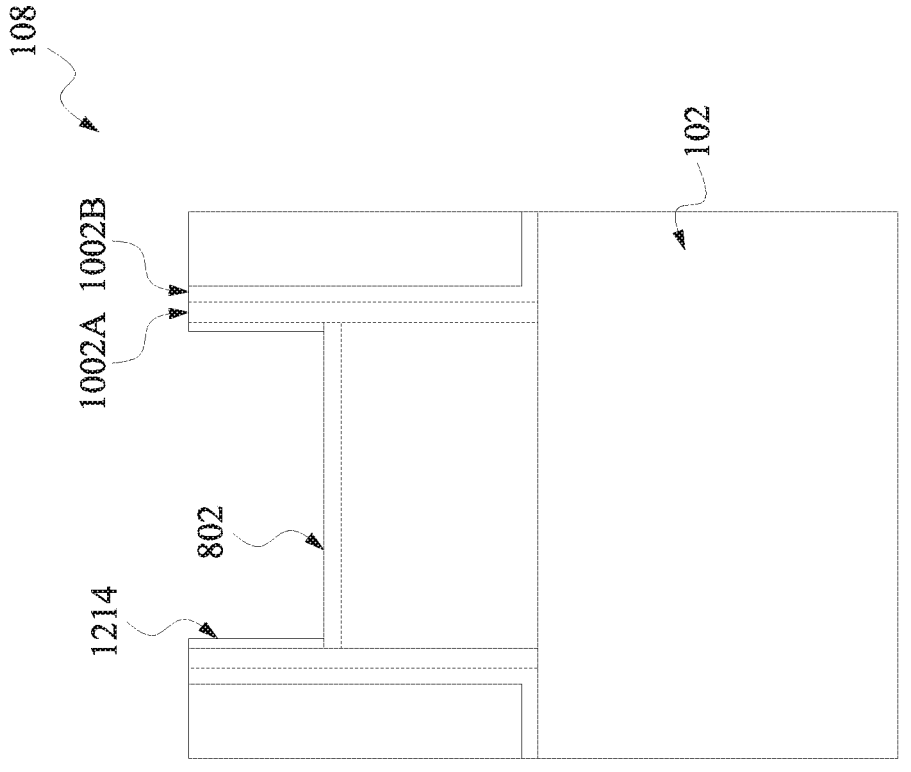
FIGS. 12C and 12D are sectional views of the semiconductor structure in FIGS. 12A and 12B, constructed in accordance with some embodiments.
Figure 12C:
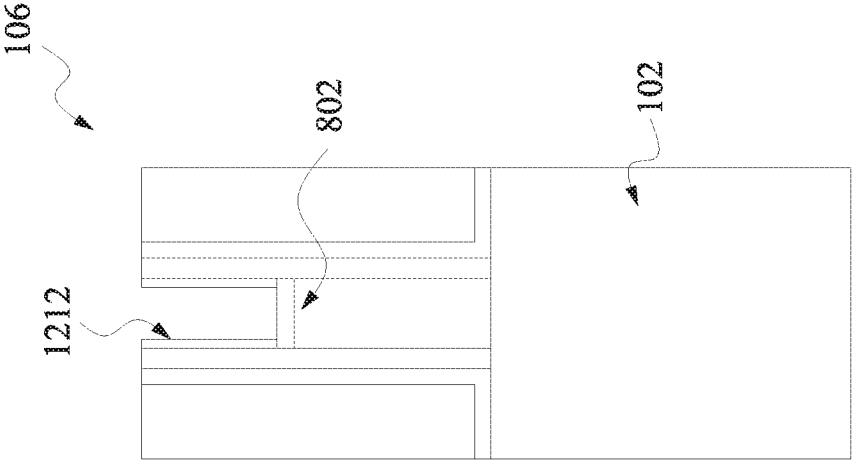

Referring to block 220 of FIG. 2 and to FIGS. 12A, 12B, 12C and 12D, a dielectric material layer is selectively formed on the sidewalls of the gate trenches while the bottom surfaces of the gate trenches are free of the dielectric material layer. FIGS. 12A and 12B are perspective views of a core device 106 and an I/O device 108 of the workpiece 100, respectively; and FIGS. 12C and 12D are sectional views of the core device 106 and the I/O device 108 through the channel regions along the cut lines 1202 and 1204 in the fin active regions, respectively.

Especially, the dielectric material layer within the core device region and the I/O device region has different thicknesses. Therefore, those are separately labeled. In the operation 220, a selective deposition is performed so that a dielectric material layer 1212 is selectively deposited on the sidewall of the gate trench of the core device 106 and a dielectric material layer 1214 is selectively deposited on the sidewall of the gate trench of the I/O device 108 such that each dielectric material layer is absent from the bottom surface of the corresponding gate trench. The dielectric material layer 1212 for the core device 106 has a first thickness T1 and the dielectric material layer 1214 for the I/O device 108 has a second thickness T2 greater than the first thickness. In some embodiments, a ratio T2/T1 is greater than 2. In some embodiments, T1 ranges between 2 angstrom and 5 angstrom while T2 ranges between 1 nanometer and 2 nanometers. The first and second dielectric material layers may be formed separately or in a collective procedure. For example, the first dielectric material layer is formed within both the core and I/O region and additional dielectric material is selectively deposited within only the I/O region while the core region is covered from deposition. The dielectric material layer 1212 or 1214 changes the dimension of the gate trench and defines the dimension of the corresponding final gate stack offset by the corresponding dielectric material layer.

Figure 13:
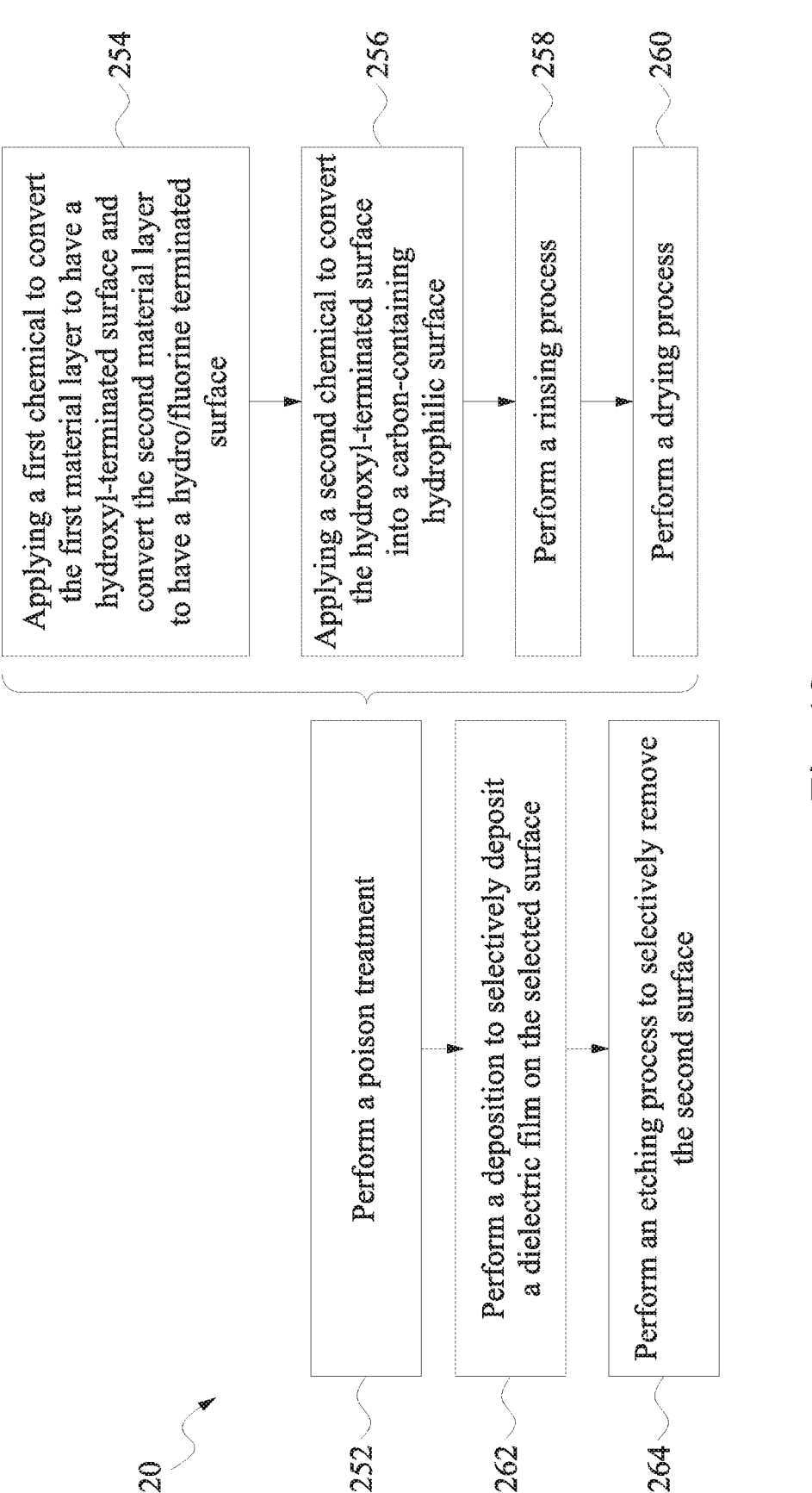
FIG. 13 is a flowchart of an integrated circuit fabrication method in accordance with some embodiments.

The selective deposition process in the operation 220 is further described below with reference to the flowchart of FIG. 13. The operation 220 includes an operation 252 with a poison process (or treatment) to the workpiece 100. The poison process changes various material layers to have different surface compositions for selective deposition. For example, the workpiece 100 includes a first surface of silicon oxide on the fin structure (including the bottom surfaces of the gate trenches) and a second surface of silicon nitride on sidewalls of the gate trenches. Each is changed to have different surface composition by the poison process. The second surface may alternatively or additionally include surface of silicon.

In the present embodiment, the poison process 252 includes a first chemical treatment 254 and a second chemical treatment 256. The first chemical treatment 254 includes applying a first chemical to convert the first material layer (silicon oxide) to have a hydroxyl terminated surface and convert the second material layer (silicon nitride or silicon) to have a hydrogen/fluorine terminated surface, according to some embodiments. In one example, the first chemical includes diluted hydrofluoric acid (DHF), such as 100:1 DHF solution. The first treatment may have a treating duration from 5 seconds to 15 second seconds. The second chemical treatment 256 includes applying a second chemical to convert the hydroxyl terminated surface into a carbon-containing hydrophilic surface. For example, the second chemical includes octadecyltrichlorosilane (ODTS) toluene solution. In the second chemical treatment, the surfaces of the workpiece are soaked in an ODTS toluene solution for a suitable duration. In one example, the surfaces of the workpiece are soaked in a 10 mM ODTS toluene solution for a duration ranging from 20 hour to 30 hour.

In some embodiments, the poison process 252 further includes a rinsing process 258 after the applying of the second chemical. The rinsing process includes rinsing the workpiece sequentially in toluene, acetone, and chloroform solutions according to some examples. The poison process 252 may further include a drying process 260 in a nitrogen environment after the rinsing.

After the poison process, the operation 220 proceeds to a deposition step 262. Due to the poisoned surface having different surface characteristics, the dielectric material layer (1212 or 1214) is only deposited on the second material layer, or the hydrogen/fluorine terminated surface in the present example. The deposition may employ a suitable deposition technology. In the present embodiment, the deposition uses ALD deposition. The ALD process includes a procedure with cycles of sequential two precursors for deposition layer by layer. In some examples, the dielectric material is silicon nitride, and the deposition of silicon nitride includes an ALD process with a first precursor having hexachlorodisilane (Si2Cl6), dichlorosilane (SiH2Cl2), disilane (Si2H6) or a combination thereof. The second precursor may include bis(tertiary-butylamino) silane (C8H22N2Si) or other suitable chemical.

After the deposition of the dielectric material, an etching process at step 264 may be followed to selectively remove the carbon-containing hydrophilic surface from the first material layer (silicon oxide).

Figures 14A, 14B:
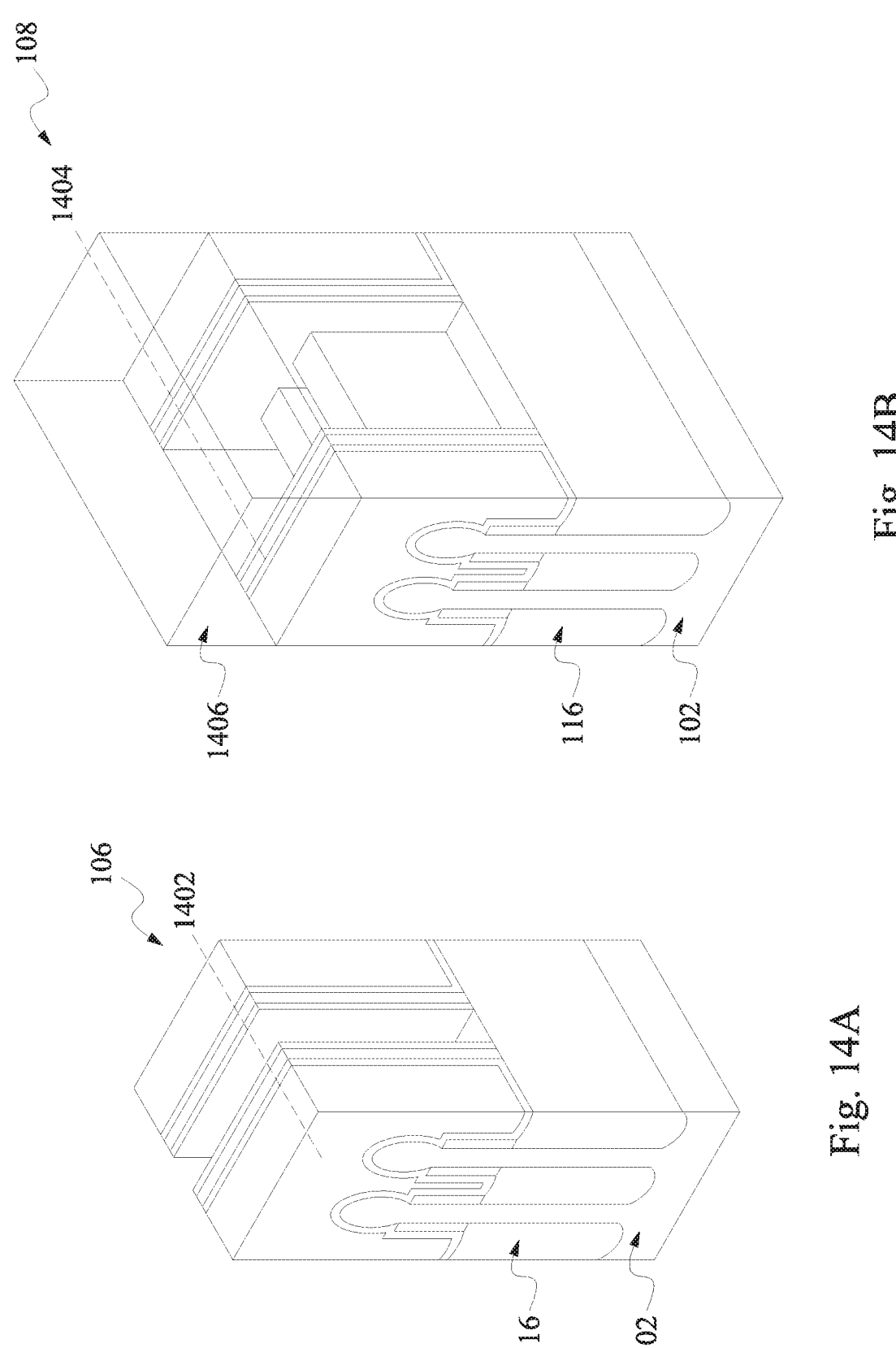
FIGS. 14A and 14B are perspective views of the semiconductor structure at a fabrication stage, constructed in accordance with some embodiments.
Figure 14D:
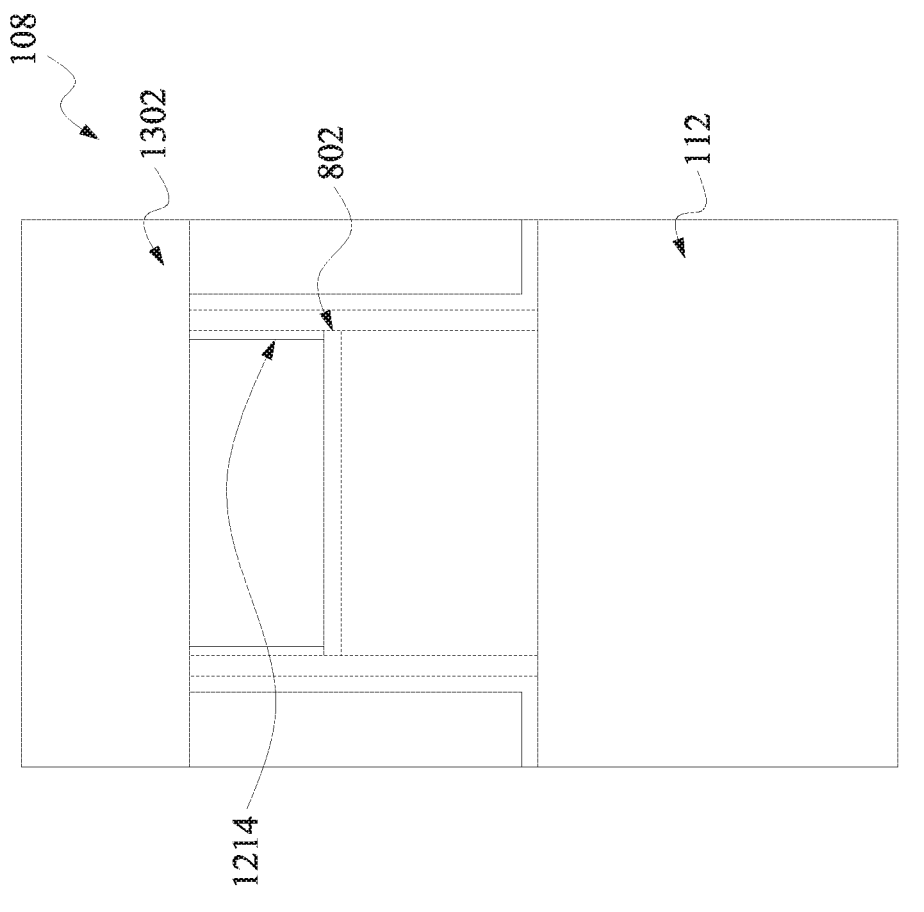
FIGS. 14C and 14D are sectional views of the semiconductor structure in FIGS. 13A and 13B, constructed in accordance with some embodiments.
Figure 14C:
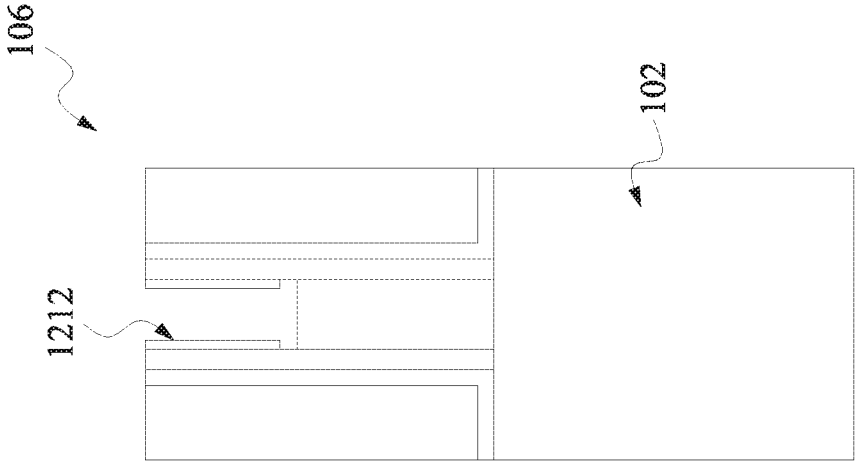

Referring back to the block 222 FIG. 2 and to FIGS. 14A, 14B, 14C and 14D, the silicon oxide dielectric layer 802 is removed from the core device region. FIGS. 14A and 14B are perspective views of a core device 106 and an I/O device 108 of the workpiece 100, respectively; and FIGS. 14C and 14D are sectional views of the core device 106 and the I/O device 108 through the channel regions along the cut lines 1402 and 1404 in the fin active regions, respectively. In the operation 222, the silicon oxide dielectric layer 802 is removed from the core device region(s). In some embodiments, the removal process includes lithography process and etching. In furtherance of the embodiments, the removal process includes forming a patterned resist layer 1406 by lithography process, wherein the patterned resist layer 1406 covers the I/O device region and has an opening configured so that the core device region is exposed therewithin. The etching process may include a wet etch, such as DHF, to selectively remove silicon oxide within the gate trenches in the core device regions.

Figure 15B:
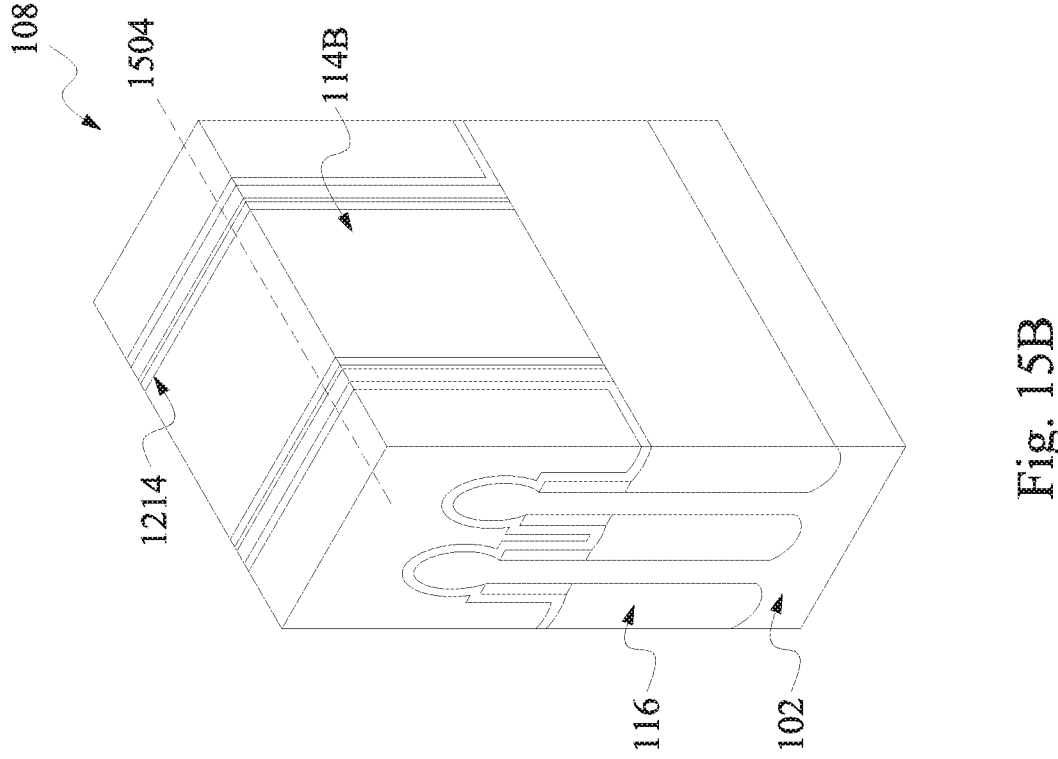
FIGS. 15A and 15B are perspective views of the semiconductor structure at a fabrication stage, constructed in accordance with some embodiments.
Figure 15A:
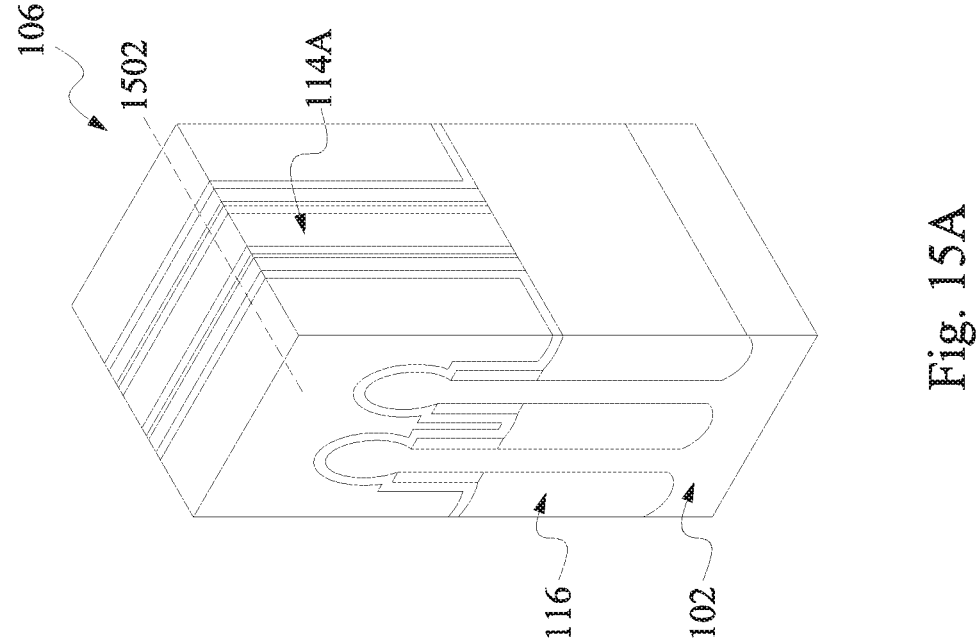
Figures 15C, 15D:
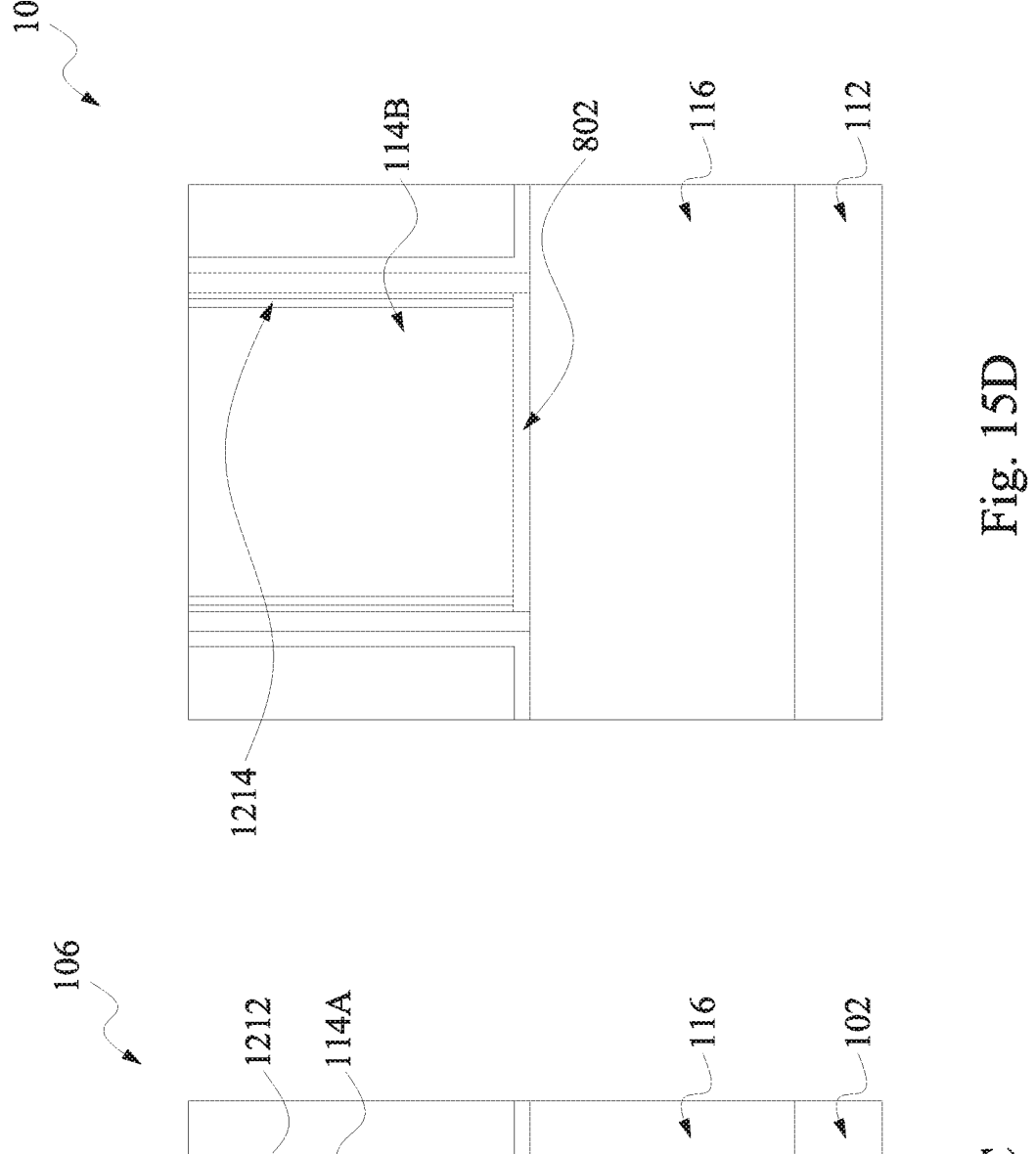
FIGS. 15C and 15D are sectional views of the semiconductor structure in FIGS. 14A and 14B, constructed in accordance with some embodiments.

Referring back to the block 224 FIG. 2 and to FIGS. 15A, 15B, 15C and 15D, the gate stacks 114 are formed in the gate trenches. FIGS. 15A and 15B are perspective views of a core device 106 and an I/O device 108 of the workpiece 100, respectively; and FIGS. 15C and 15D are sectional views of the core device 106 and the I/O device 108 through the source/drain regions along the cut lines 1502 and 1504 in the fin active regions, respectively. In the operation 224, the gate stack 114A is formed in a gate trench of the core device region, and a gate stack 114B is formed in a gate trench of the I/O device region.

The gate stack 114 (such as 114A or 114B) is formed on the workpiece 100 wrapping around the channel regions 112 of the fin structure 104. In some embodiments, the gate stack 114 is a high-k metal gate that includes a gate dielectric layer of high-k dielectric material and a gate electrode of metal or metal alloy. In some examples, the gate dielectric layer and the gate electrode each may include a number of sub-layers. The high-k dielectric layer may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The gate electrode may include Ti, Ag, Al, TiAlN, TaC, TaCN, TaSiN, Mn, Zr, TiN, TaN, Ru, Mo, Al, WN, Cu, W, or any suitable materials. In some embodiments, different metal materials are used for nFET and pFET devices with respective work functions. The gate stack 114 is formed in the gate trench by a procedure, such as a procedure that includes deposition and CMP. Although it is understood that the gate stack 114 may be any suitable gate structure.

Figure 16:
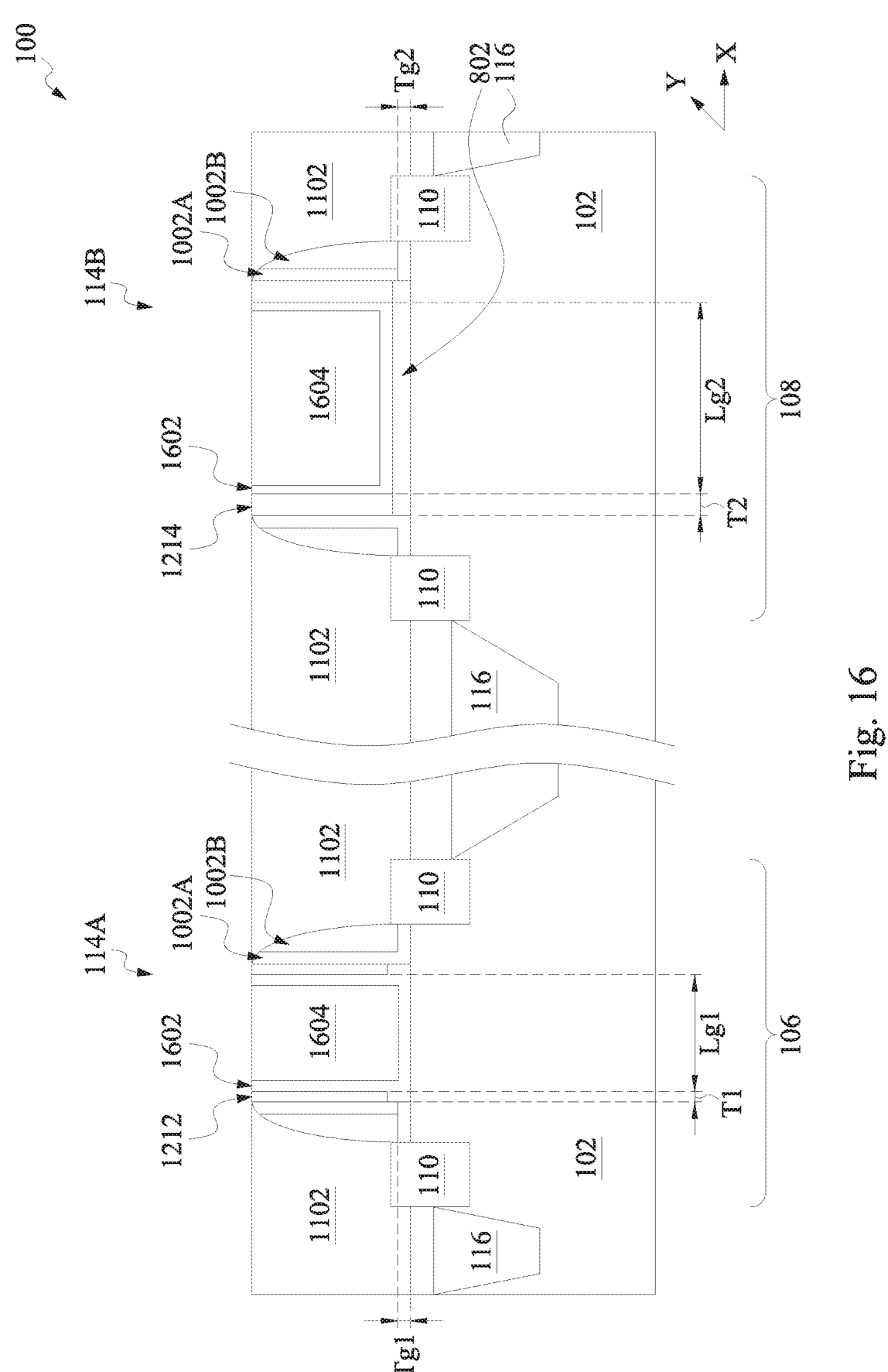
FIG. 16 is a sectional view of the semiconductor structure in FIGS. 15A and 15B, constructed in accordance with some embodiments.

The structure of the work piece 100, especially the gate structure, is further described with reference to FIG. 16. FIG. 16 is a sectional view of the core device (the core FET) 106 and the I/O device (the I/O FET) 108 along the cut line 122 in the fin active region, in accordance with some embodiments. The fin structure 104 is a continuous portion of the substrate 102 and extrudes above the STI 116.

The core device 106 includes the gate stack 114A and source/drain features 110 disposed on both sides of the gate stack 114A. The gate stack 114A includes a gate dielectric layer 1502 and a gate electrode 1504 surrounding by the gate dielectric layer 1502. The gate dielectric layer 1502 is U-shaped configured within the gate trench. In the illustrated example, the fin active regions oriented in X direction while the gate stack 114A is oriented in the Y direction. The gate stack 114A spans along the X direction with a dimension Lg1, usually referred to as gate length since it defines channel length. The gate dielectric layer has a thickness Tg1. The core device 106 further includes gate sidewall feature 1002, such as a seal layer 1002A, a gate spacer 1002B or both. In the present embodiment, the seal layer 1002A is L-shaped. It includes a first segment extending vertically from the top surface of the gate stack 114A to the fin structure 104, and a second segment extending laterally on the fin structure along the X direction. The gate spacer 1002B is formed on the sidewall of the seal layer 1002A and on the top of the second segment of the seal layer.

In one such embodiment, the gate dielectric layer 1602 includes an interfacial layer deposited by a suitable method, such as ALD, CVD, ozone oxidation, etc. The interfacial layer may include silicon oxide, silicon nitride, silicon oxynitride, and/or other suitable material. In some embodiments, the gate dielectric layer includes a high-k dielectric layer deposited on the interfacial layer (if the interfacial layer presents) by a suitable technique, such as ALD, CVD, metal-organic CVD (MOCVD), PVD, thermal oxidation, combinations thereof, and/or other suitable techniques.

The gate electrode material is then filled in the gate trench. The gate electrode 1604 is formed by ALD, PVD, CVD, plating, other suitable process, or a combination thereof. The gate electrode may include a single layer or multiple layers, such as a metal layer, a liner layer, a wetting layer, and/or an adhesion layer. After filling the gate electrode material, a CMP process may be performed to produce a substantially planar top surface of the gate stack 114A (114B as well). After the gate stack 114 is formed, the workpiece 100 may be provided for further fabrication, such as contact formation and further fabrication of the interconnect structure.

Furthermore, the core device 106 includes a dielectric material layer 1212 interposed between the gate stack 114A and the gate sidewall feature 1002 (1002A and 1002B). The dielectric material layer 1212 is formed by selective deposition; extends vertically from the top surface of the gate stack 114A and has a uniform thickness T1. Here, a uniform thickness (T1 and similarly for the uniform thickness T2 described later) means, the thickness of the corresponding layer has a very small variation, such as less than 10%.

The I/O device 108 includes the gate stack 114B and source/drain features 110 disposed on both sides of the gate stack 114B. The gate stack 114B includes the gate dielectric layer 1602 and a gate electrode 1504 surrounding by the gate dielectric layer 1602. The gate dielectric layer 1602 is U-shaped configured within the gate trench. The gate stack 114B is oriented in the Y direction and spans along the X direction with a dimension Lg2, referred to as gate length. In the present embodiment, Lg2 is greater than Lg1. The gate dielectric layer 1602 has a thickness Tg1. However, the total gate dielectric layer for the I/O device 108 includes both the silicon oxide layer 802 and gate dielectric layer 1602. Thus, the collective thickness of the gate electric for the I/O device 108 is Tg2, which is greater than Tg1. In other words, the equivalent oxide thickness of the gate dielectric for the I/O device 108 is greater than the equivalent oxide thickness of the gate dielectric for the core device 106, thus making the I/O device more robust for power surges. The I/O device 108 further includes gate sidewall feature 1002, such as a seal layer 1002A, a gate spacer 1002B or both, similar to those of the core device 106. In the present embodiment, the seal layer 1002A is L-shaped. It includes a first segment extending vertically from the top surface of the gate stack 114B to the fin structure 104, and a second segment extending laterally on the fin structure along the X direction. The gate spacer 1002B is formed on the sidewall of the seal layer 1002A and on the top of the second segment of the seal layer.

Furthermore, the I/O device 108 includes a dielectric material layer 1214 interposed between the gate stack 114B and the gate sidewall feature 1002 (such as 1002A and 1002B) within the I/O device 108. The dielectric material layer 1214 is formed by selective deposition; extends vertically from the top surface of the gate stack 114B and ends above (may touch in some cases) the silicon oxide layer 802; and has a uniform thickness T2, wherein T2 is greater than T1. In some examples, a ratio of T2/T1 is greater than 2. In some examples, T1 ranges from 2 angstrom to 5 angstrom while T2 ranges from 1 nanometer to 2 nanometers.

Especially, the dummy gate has a large dimension than the corresponding dimension (Lg1 or Lg2) of the final gate (114A or 114B). Even a final gate has a smaller dimension, a corresponding dummy gate made by the disclosed method has a greater dimension, thus being stronger and robust to sustain its shape and position without collapsing. As described above, the gates may stick together when the semiconductor fabrication moves to advanced technology nodes with less feature sizes and high pattern densities. The disclosed method and structure provide a semiconductor structure to eliminate the above issues. Especially, the core device 106 and the I/O device 108 are designed and fabricated with different characteristics (gate dielectric thickness and sidewall dielectric thickness T1 and T2) for respective performance tuning and enhancement.

The dielectric material layer 1212/1214 and the gate sidewall features 1002 are chosen with certain compositions and surface characteristics to achieve selective deposition, which further promotes the gate robustness to address the sticking issues, such as during wet etching or wet cleaning. In some embodiments, the dielectric material layer 1212 or 1214 is a silicon nitride layer. The inner surface of the gate sidewall features 1002 contacts the dielectric material layer (1212 or 1214) and is a silicon nitride surface. For example, when the gate sidewall features 1002 include only one material layer, it is a silicon nitride layer. In other examples, the gate sidewall features 1002 include a seal layer 1002A and a gate spacer 1002B, the seal layer 1002A is a silicon nitride layer while the gate spacer 1002B is a silicon oxide layer or a silicon nitride layer.

The gate electrode 1604 is further described with reference to FIG. 17 as a sectional view. The gate electrode 1604 may represent the gate electrode for the core device 106 or the gate electrode for the I/O device 108 with detailed gate material layers, in accordance with some embodiments.

Figure 17:
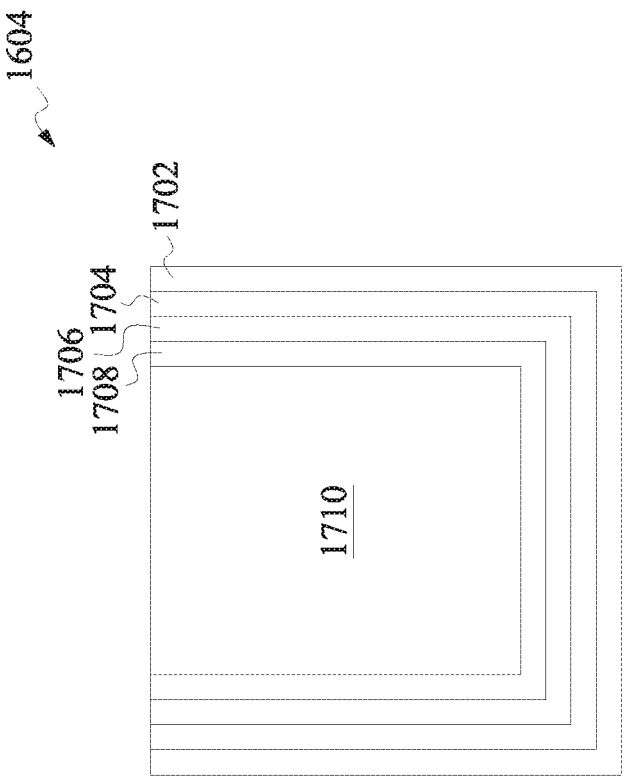
FIG. 17 is a sectional view of the gate electrode of the semiconductor structure in FIG. 16, constructed in accordance with some embodiments.

As illustrated in FIG. 17, the gate electrode 1604 includes a capping layer 1702, a blocking layer 1704, a work function metal layer 1706, another blocking layer 1708 and a filling metal layer 1710. In furtherance of the embodiments, the capping layer 1702 includes titanium nitride, tantalum nitride, or other suitable material, formed by a proper deposition technique such as ALD. The blocking layer 1704 includes titanium nitride, tantalum nitride, or other suitable material, formed by a proper deposition technique such as ALD. In some examples, the block layers may not present or only one of them presents in the gate electrode.

The work functional metal layer 1706 includes a conductive layer of metal or metal alloy with proper work function such that the corresponding FET is enhanced for its device performance. The work function (WF) metal layer 1706 is different for a pFET and a nFET, respectively referred to as an n-type WF metal and a p-type WF metal. The choice of the WF metal depends on the FET to be formed on the active region. For example, the semiconductor structure 100 includes a first active region for an nFET and another active region for a pFET, and accordingly, the n-type WF metal and the p-type WF metal are respectively formed in the corresponding gate stacks. Particularly, an n-type WF metal is a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher.

In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD.

The blocking layer 1708 includes titanium nitride, tantalum nitride, or other suitable material, formed by a proper deposition technique such as ALD. In various embodiments, the filling metal layer 1710 includes aluminum, tungsten or other suitable metal. The filling metal layer 1710 is deposited by a suitable technique, such as PVD or plating.

The present disclosure provide a method making a semiconductor structure having various FinFETs and the semiconductor structure wherein the FinFETs have different configuration and dimensions, depending on core device or I/O device. Various advantages may present in different embodiments. The method includes selective deposition such that the dummy gates have greater dimensions to survive wet etching/cleaning without collapsing. Different structures of the core and I/O devices enhance the respective device performance.

Thus, the present disclosure provides a semiconductor structure in accordance with some embodiments. The semiconductor structure includes a fin structure on a substrate; a first gate stack and a second gate stack formed on the fin structure; a dielectric material layer disposed on the first and second gate stacks, wherein the dielectric layer includes a first portion disposed on a sidewall of the first gate stack with a first thickness and a second portion disposed on a sidewall of the second gate stack with a second thickness greater than the first thickness; a first gate spacer disposed on the first portion of the dielectric material layer; and a second gate spacer disposed on the second portion of the dielectric material layer.

The present disclosure also provides a semiconductor structure in accordance with some other embodiments. The semiconductor structure includes a first gate stack and a second gate stack formed on a substrate; a dielectric material layer disposed the first and second gate stacks, wherein the dielectric layer includes a first portion disposed on a sidewall of the first gate stack with a first thickness and a second portion disposed on a sidewall of the second gate stack with a second thickness greater than the first thickness; a first gate spacer disposed on the first portion of the dielectric material layer; and a second gate spacer disposed on the second portion of the dielectric material layer.

The present disclosure also provides a semiconductor structure in accordance with some other embodiments. The semiconductor structure includes a first field-effect transistor (FET) disposed on a first fin structure, wherein the first FET further includes a first gate stack, first source/drain features disposed on both sides of the first gate stack, a first gate spacer disposed on a sidewall of the first gate stack, and a first dielectric material layer interposed between and the first gate spacer and the sidewall of the first gate stack; and a second FET disposed on a second fin structure, wherein the second FET further includes a second gate stack, second source/drain features disposed on both sides of the second gate stack, a second gate spacer disposed on a sidewall of the second gate stack, and a second dielectric material layer interposed between the second gate spacer and the sidewall of the second gate stack. The first dielectric material layer has a first thickness T1, and the second dielectric material layer has a second thickness T2 greater than the first thickness.

The semiconductor structure includes a first field-effect transistor (FET) disposed on a substrate, wherein the first FET further includes a first gate stack, first source/drain features disposed on both sides of the first gate stack, a first gate spacer disposed on a sidewall of the first gate stack, and a first dielectric material layer interposed between and the first gate spacer and the sidewall of the first gate stack; and a second FET disposed on the substrate, wherein the second FET further includes a second gate stack, second source/ drain features disposed on both sides of the second gate stack, a second gate spacer disposed on a sidewall of the second gate stack, and a second dielectric material layer interposed between the second gate spacer and the sidewall of the second gate stack. The first dielectric material layer has a first thickness T1, and the second dielectric material layer has a second thickness T2 greater than the first thickness.

The present disclosure provides a method of fabricating a semiconductor structure. The method includes forming a dummy gate on a semiconductor substrate; forming an interlayer dielectric layer (ILD) on the semiconductor substrate; removing the dummy gate, thereby resulting in a gate trench in the ILD; forming a dielectric material layer in the gate trench such that the dielectric material layer is disposed on sidewalls of the gate trench and is absent from a bottom surface of the gate trench; and forming a metal gate in the gate trench, thereby the gate spans a dimension less than a corresponding dimension of the dummy gate by a thickness of the dielectric material layer.

In various embodiments, the method may further includes performing a rinsing process after the applying of the second chemical and performing a drying process in nitrogen environment, wherein the rinsing process includes rinsing sequentially in toluene, acetone, and chloroform. The method may further include applying an etching process to selectively removing the carbon-containing hydrophilic surface from the first material layer after the deposition process. In the method, the first material layer is a silicon oxide layer and the second material layer is one of a silicon layer and a silicon nitride layer according to some examples.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first gate stack disposed on a substrate, the first gate stack including a first gate dielectric layer and a first gate electrode;
a first spacer layer disposed on the first gate stack and interfacing with the first gate dielectric layer and a portion of the substrate, the portion of the substrate being adjacent the first gate dielectric layer and free of any source/drain feature;
a second spacer layer disposed on the first spacer layer and formed of a different material than the first spacer layer; and
a first dielectric layer disposed between the first spacer layer and the first gate dielectric layer such that the first dielectric layer interfaces with the first gate dielectric layer and the first spacer layer, wherein a first portion of the first gate dielectric layer extends under the first dielectric layer such that the first portion of the first gate dielectric layer is disposed between the substrate and the first dielectric layer, the first portion of the first gate dielectric layer having a first thickness, and wherein a second portion of the first gate dielectric layer extends under the first gate electrode, the second portion of the first gate dielectric layer having a second thickness that is less than the first thickness.

2. The device of claim 1, wherein the first spacer layer has first sidewall surface facing the second spacer layer and an opposing second sidewall surface facing the first gate stack, and
wherein the first dielectric layer extends from the second sidewall of the first spacer layer to the first gate dielectric layer.

3. The device of claim 1, further comprising:
a second gate stack disposed on the substrate, the second gate stack including a second gate dielectric layer and a second gate electrode, the second gate dielectric layer being thicker than the first gate dielectric layer;
a third spacer layer disposed on the second gate stack and interfacing with the second gate dielectric layer;
a fourth spacer layer disposed on the third spacer layer and formed of a different material than the third spacer layer; and
a second dielectric layer disposed between the third spacer layer and the second gate dielectric layer such that the second dielectric layer interfaces with the second gate dielectric layer and the third spacer layer.

4. The device of claim 3, wherein the second gate dielectric layer is formed of a first material layer and a second material layer disposed on the first material layer, the second material layer having a u-shaped cross-sectional profile.

5. The device of claim 4, wherein the first material layer is wider than the second material layer.

6. The device of claim 4, wherein the first material layer interfaces with a bottom surface of the second dielectric layer, the bottom surface of the second dielectric layer facing the substrate.

7. The device of claim 1, further comprising a source/ drain feature disposed on the substrate, and
wherein the first spacer layer and the second spacer layer interface with the source/drain feature.

8. The device of claim 1, wherein the first gate dielectric layer and the first gate electrode extend to a first height above the substrate, and
wherein the first spacer layer is disposed along an entire length of a first sidewall of the first gate stack such that the first spacer layer does not extend beyond the first height above the substrate, wherein no portion of the first spacer layer is disposed over a top surface of the first gate electrode, the top surface of the first gate electrode facing away from the substrate.

9. A device comprising:
a first gate stack and a second gate stack disposed on a substrate;
a first dielectric material layer disposed on a sidewall of the first gate stack with a first thickness, wherein the first dielectric material layer is formed of the same material throughout the first dielectric material layer; and
a second dielectric material layer disposed on a sidewall of the second gate stack with a second thickness that is different than the first thickness, wherein the second dielectric material layer is formed of the same material throughout the second dielectric material layer, and wherein the first gate stack includes a first gate dielectric layer and a first gate electrode over the first gate dielectric layer, wherein a first portion of the first gate dielectric layer extends under the first dielectric material layer such that the first portion of the first gate dielectric layer is disposed between the substrate and the first dielectric material layer, wherein a second portion of the first gate dielectric layer is disposed between and interfaces with a sidewall of the first gate electrode and a sidewall of the first dielectric material layer, wherein the first dielectric material layer physically contacts the first gate dielectric layer, and wherein the second gate stack includes a second gate dielectric layer and a second electrode over the second gate dielectric layer, the second gate dielectric layer having a different thickness than that of the first gate dielectric layer, wherein a first portion of the second gate dielectric layer extends under the second dielectric material layer such that the first portion of the second gate dielectric layer is disposed between the substrate and the second dielectric material layer, wherein a second portion of the second gate dielectric layer is disposed between and interfaces with a sidewall of the second gate electrode and a sidewall of the second dielectric material layer, wherein the second dielectric material layer physically contacts the second gate dielectric layer.

10. The device of claim 9, further comprising a first spacer disposed along the first dielectric material layer and the first gate dielectric layer such that the first spacer interfaces with the first dielectric material layer and a sidewall of the first portion of the first gate dielectric layer, wherein the first dielectric material layer is disposed between the second portion of the first gate dielectric layer and the first spacer.

11. The device of claim 10, further comprising a second spacer disposed on the first spacer, and wherein the first spacer has a vertical portion extending vertically along the first dielectric material layer and a horizontal portion extending horizontally away from the first gate stack, and wherein the second spacer interfaces with both the vertical portion and the horizontal portion of the first spacer.

12. The device of claim 9, wherein the second gate dielectric layer is formed of a first material layer and a second material layer, the second material layer being formed of a different material than the first material layer.

13. The device of claim 12, wherein the second material layer has a u-shaped profile and the first material layer extends horizontally beyond the u-shaped profile of the second material layer.

14. The device of claim 9, wherein the first gate dielectric layer is formed of the same material throughout the first gate dielectric layer.

15. The device of claim 9, wherein a top surface of the first gate stack is substantially coplanar with a top surface of the second gate stack, the top surfaces of the first and second gate stacks facing away from the substrate.

16. A device comprising:

a first gate stack disposed over a substrate, the first gate stack extending to a first height above the substrate;

a first gate spacer disposed along an entire length of a first sidewall of the first gate stack such that the first gate spacer does not extend beyond the first height above the substrate, wherein a bottom surface of the first gate spacer interfaces the substrate;

a first dielectric material layer disposed along a first portion of the first sidewall of the first gate stack without being disposed along a second portion of the first sidewall, wherein the first dielectric material layer physically contacts the first gate spacer and the first portion of the first sidewall of the first gate stack;

a second gate stack disposed over a substrate;

a second gate spacer disposed along an entire length of a second sidewall of the second gate stack; and a second dielectric material layer disposed along a first portion of the second sidewall of the second gate stack without being disposed along a second portion of the second sidewall, wherein the second dielectric material layer physically contacts the second gate spacer and the first portion of the second sidewall of the second gate stack, wherein the first gate stack includes a first gate dielectric layer and a first gate electrode over the first gate dielectric layer, wherein the second gate stack includes a second gate dielectric layer and a second gate electrode over the second gate dielectric layer, wherein the second gate dielectric layer does not extend between a bottom surface of the second spacer and the substrate, wherein a portion of the first gate dielectric layer is sandwiched between a sidewall portion of the first dielectric material layer and a sidewall of the first gate electrode, wherein a portion of the second gate dielectric layer is sandwiched between a sidewall portion of the second dielectric material layer and a sidewall of the second gate electrode.

17. The device of claim 16, wherein the second portion of the first sidewall is closer to the substrate than the first portion of the first sidewall of the first gate stack.

18. The device of claim 16, wherein the first gate spacer has a first L-shaped sidewall surface.

19. The device of claim 16, wherein the first dielectric material layer has a constant first thickness extending along the first portion of the first sidewall of the first gate stack, wherein the first dielectric material layer is formed of the same material throughout the first dielectric material layer, wherein the second dielectric material layer has a constant second thickness extending along the first portion of the second sidewall of the second gate stack, wherein the second dielectric material layer is formed of the same material throughout the second dielectric material layer, wherein the constant second thickness of the second dielectric material layer is thicker than the constant first thickness of the first dielectric material layer, and wherein the second gate dielectric layer is thicker than the first gate dielectric layer.

20. The device of claim 16, wherein a first portion of the first gate dielectric layer extends under the first dielectric material layer such that the first portion of the first gate dielectric layer is disposed between the substrate and the first dielectric material layer, the first portion of the first gate dielectric layer having a first thickness, and wherein a second portion of the first gate dielectric layer extends under the first gate electrode layer, the second portion of the first gate dielectric layer having a second thickness that is less than the first thickness.

\* \* \* \* \*